(12) United States Patent
Yen et al.

(10) Patent No.: US 10,276,377 B2
(45) Date of Patent: Apr. 30, 2019

(54) METHOD FOR PATTERNING INTERCONNECTS

(71) Applicant: Taiwan Semiconductor Manufacturing Co., Ltd., Hsinchu (TW)

(72) Inventors: Yung-Sung Yen, New Taipei (TW); Yu-Hsun Chen, Taichung (TW); Chen-Hau Wu, New Taipei (TW); Chun-Kuang Chen, Hsinchu County (TW); Ta-Ching Yu, Hsinchu County (TW); Ken-Hsien Hsieh, Taipei (TW); Ming-Jhih Kuo, Hsinchu County (TW); Ru-Gun Liu, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/593,149

(22) Filed: May 11, 2017

(65) Prior Publication Data
US 2017/0338146 A1 Nov. 23, 2017

Related U.S. Application Data

(60) Provisional application No. 62/339,484, filed on May 20, 2016.

(51) Int. Cl.
*H01L 21/033* (2006.01)
*H01L 21/311* (2006.01)
(Continued)

(52) U.S. Cl.
CPC ...... *H01L 21/0337* (2013.01); *H01L 21/0273* (2013.01); *H01L 21/0332* (2013.01);
(Continued)

(58) Field of Classification Search
CPC .......... H01L 21/0332; H01L 21/76802; H01L 21/31144; H01L 23/528; H01L 21/0337; H01L 21/76816; H01L 21/0273
See application file for complete search history.

(56) References Cited

U.S. PATENT DOCUMENTS 6,007,968 A * 12/1999 Furukawa ............... G03F 7/038
                                                  257/E21.027
6,274,493 B1 * 8/2001 Yu ..................... H01L 21/76814
                                                  257/E21.255

(Continued)

*Primary Examiner* — Jasmine J Clark
(74) *Attorney, Agent, or Firm* — Haynes and Boone, LLP

(57) ABSTRACT

Various patterning methods involved with manufacturing semiconductor devices are disclosed herein. A method for fabricating a semiconductor structure (for example, interconnects) includes forming a patterned photoresist layer over a dielectric layer. An opening (hole) is formed in the patterned photoresist layer. In some embodiments, a surrounding wall of the patterned photoresist layer defines the opening, where the surrounding wall has a generally peanut-shaped cross section. The opening in the patterned photoresist layer can be used to form an opening in the dielectric layer, which can be filled with conductive material. In some embodiments, a chemical layer is formed over the patterned photoresist layer to form a pair of spaced apart holes defined by the chemical layer, and an etching process is performed on the dielectric layer using the chemical layer as an etching mask to form a pair of spaced apart holes through the dielectric layer.

20 Claims, 18 Drawing Sheets

(51) Int. Cl.
*H01L 21/768* (2006.01)
*H01L 21/027* (2006.01)
*H01L 23/528* (2006.01)

(52) U.S. Cl.
CPC .. *H01L 21/31144* (2013.01); *H01L 21/76802* (2013.01); *H01L 21/76816* (2013.01); *H01L 23/528* (2013.01); *H01L 23/5283* (2013.01)

(56) References Cited

U.S. PATENT DOCUMENTS

| | | | |
|---|---|---|---|
| 7,148,142 B1 * | 12/2006 | Dakshina-Murthy | ........................ B82Y 10/00 438/678 |
| 8,669,180 B1 | 3/2014 | Lee et al. | |
| 8,697,537 B2 | 4/2014 | Lee et al. | |
| 2013/0187237 A1 | 7/2013 | Yu et al. | |

\* cited by examiner

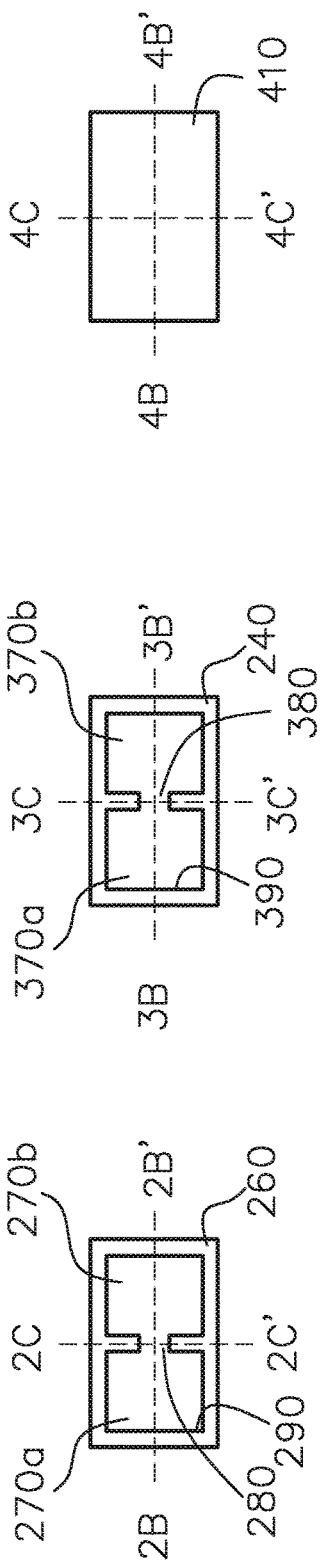
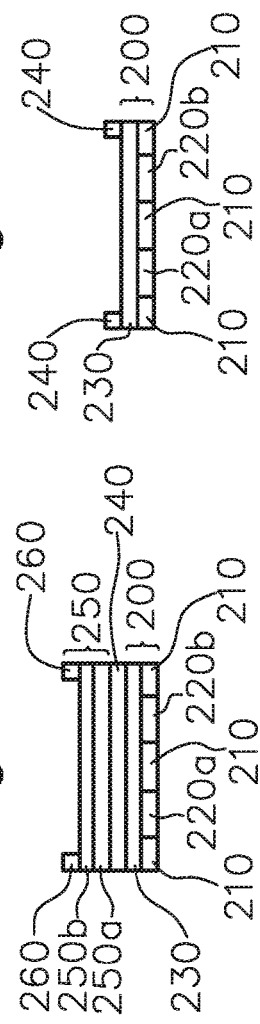
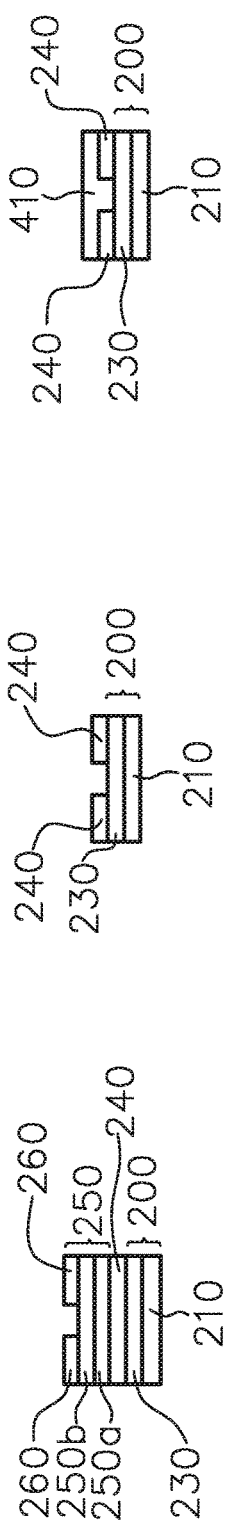
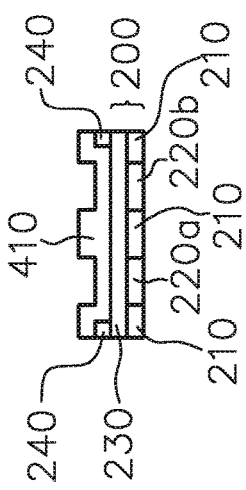
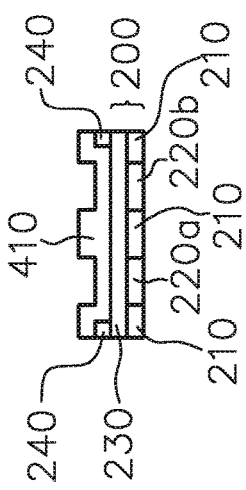
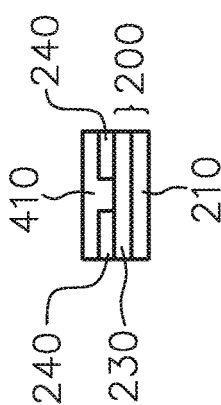

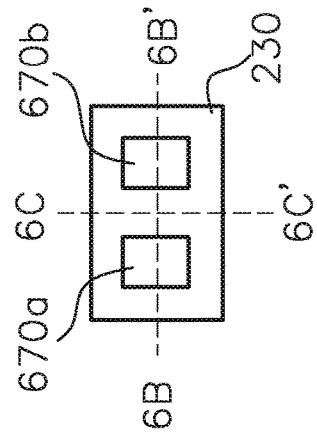
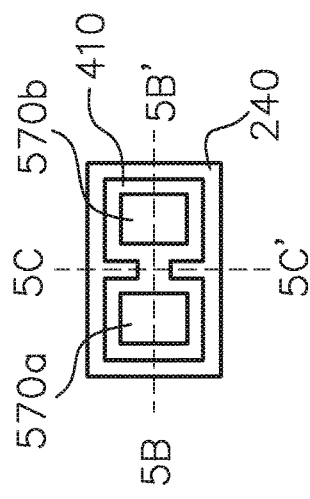
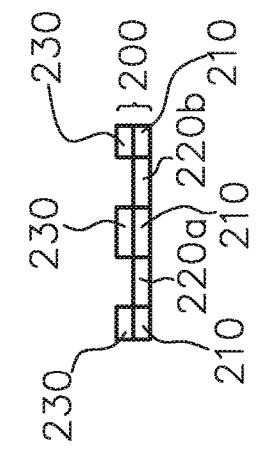
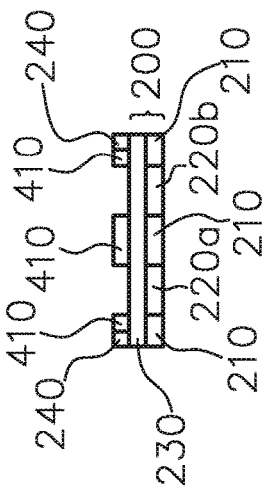
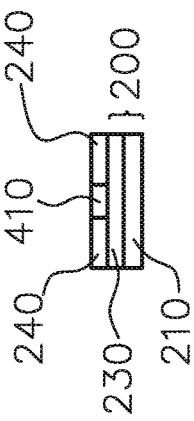

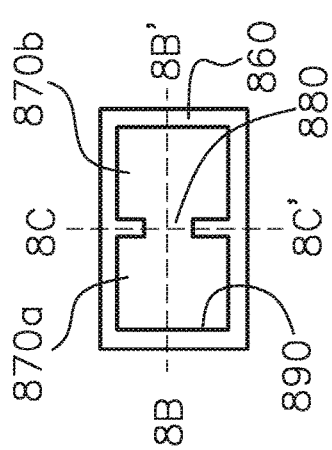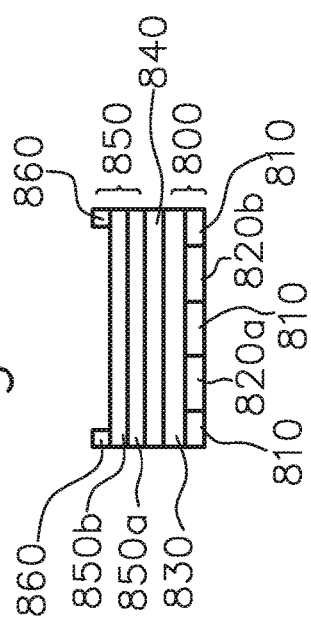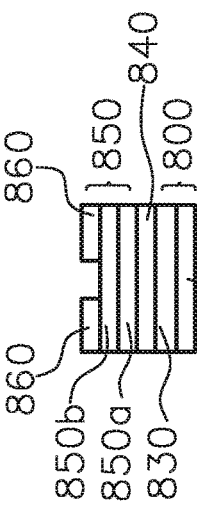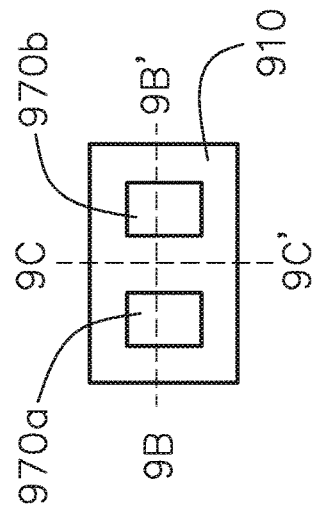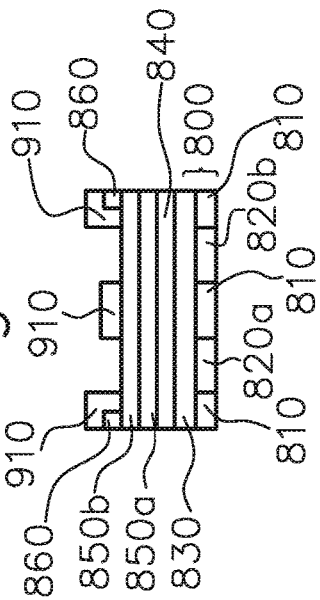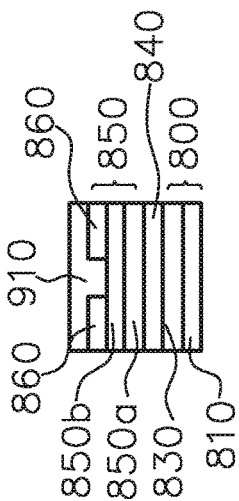

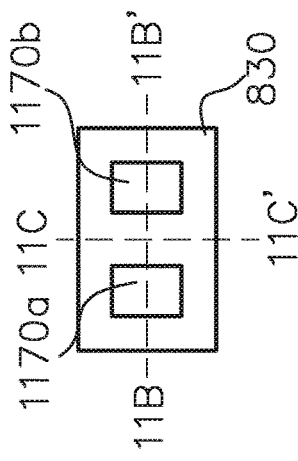
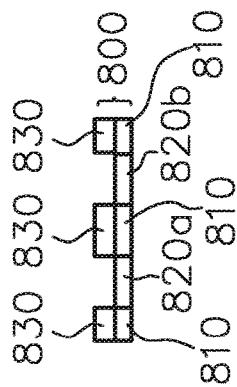
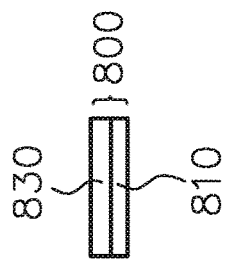
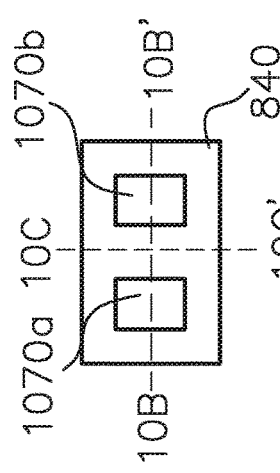
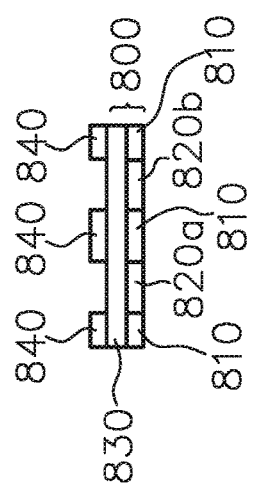
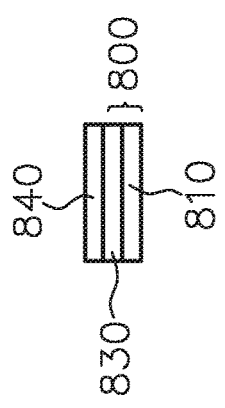

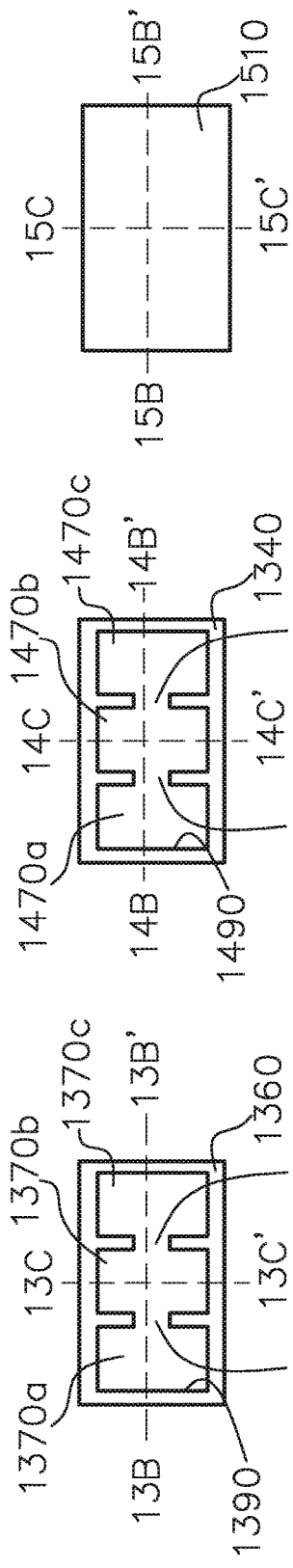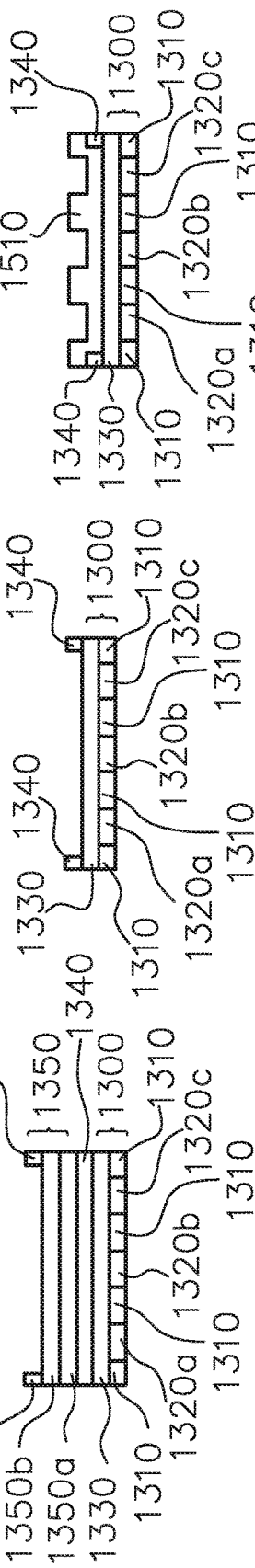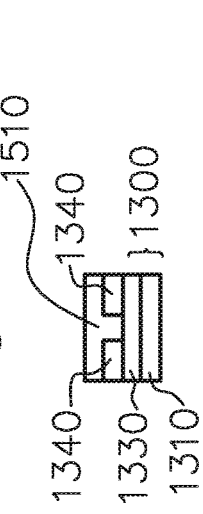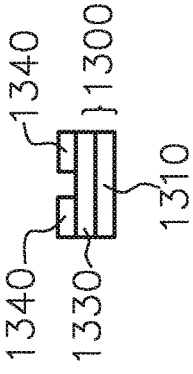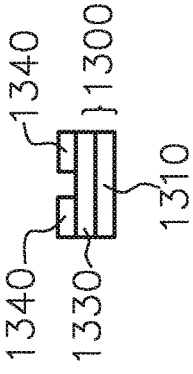

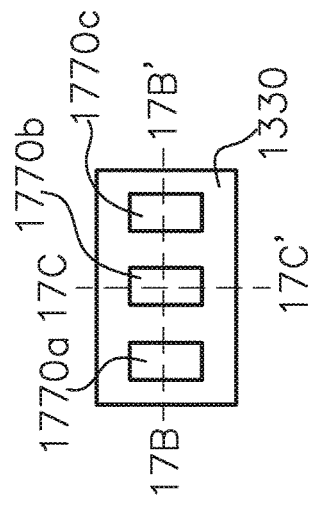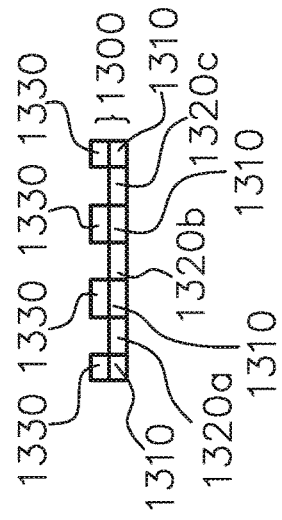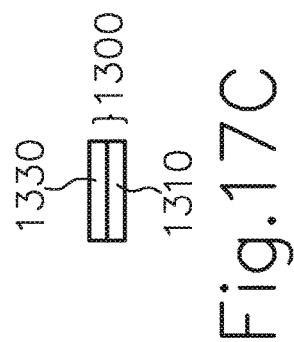
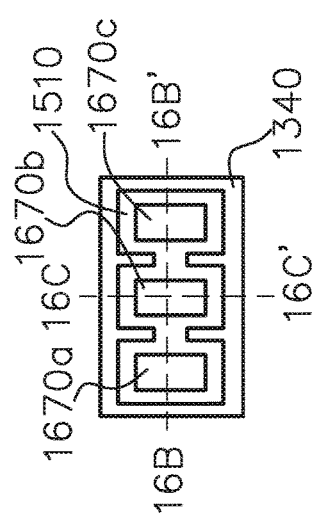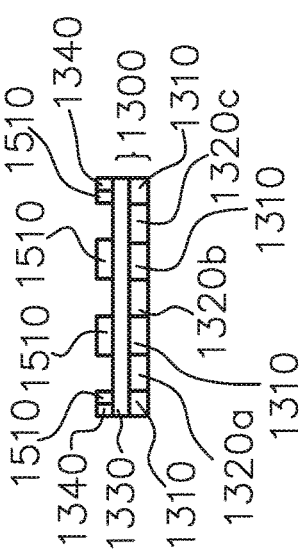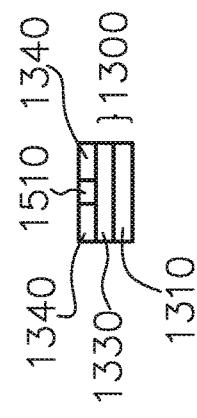

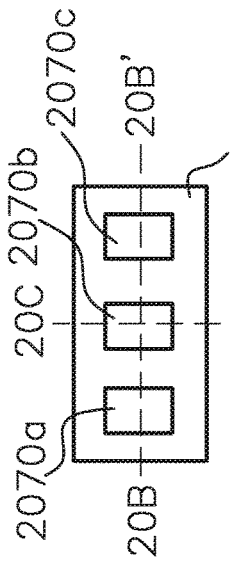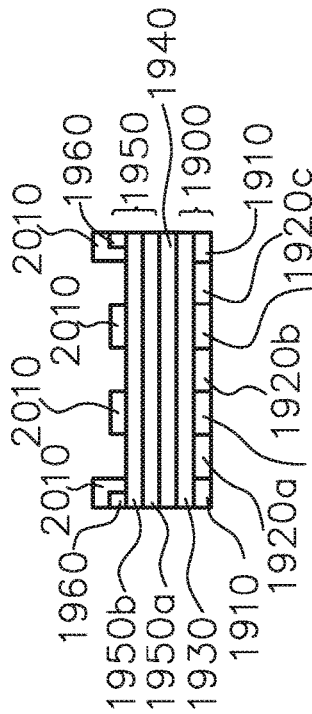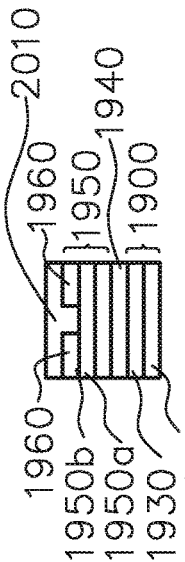
Fig. 19A  Fig. 19B  Fig. 19C
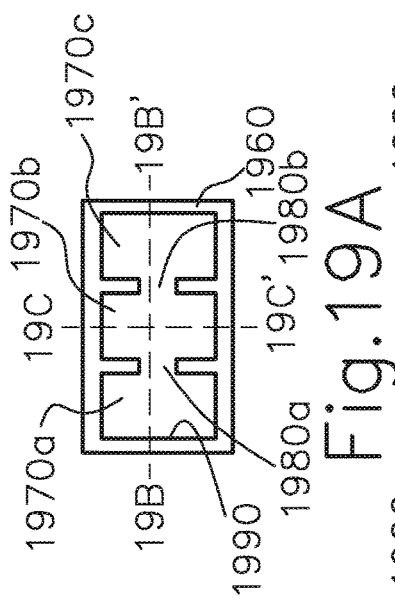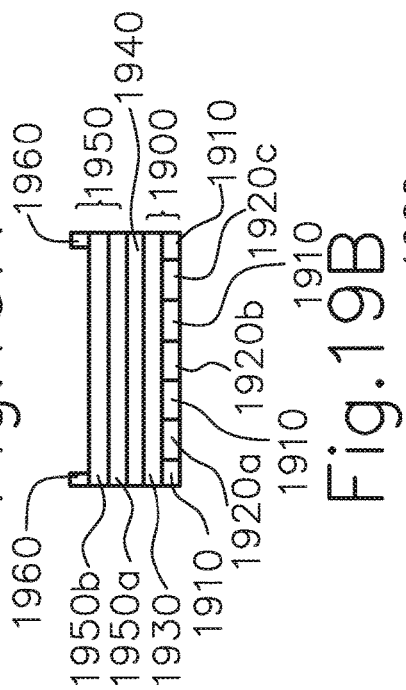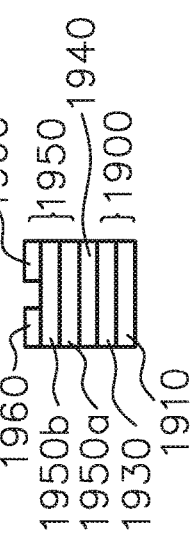
Fig. 20A  Fig. 20B  Fig. 20C

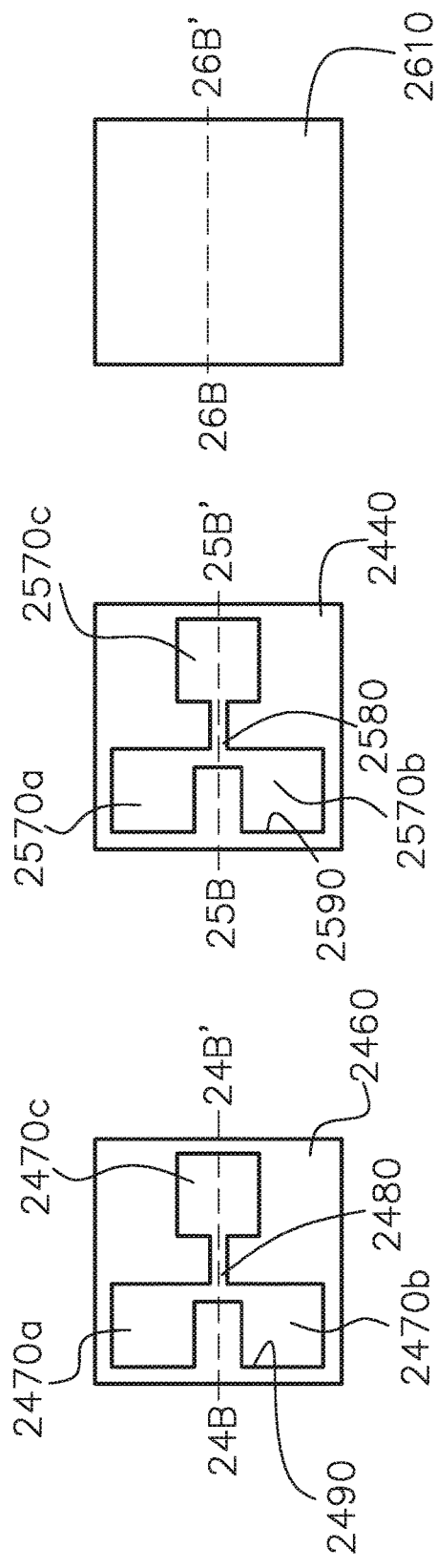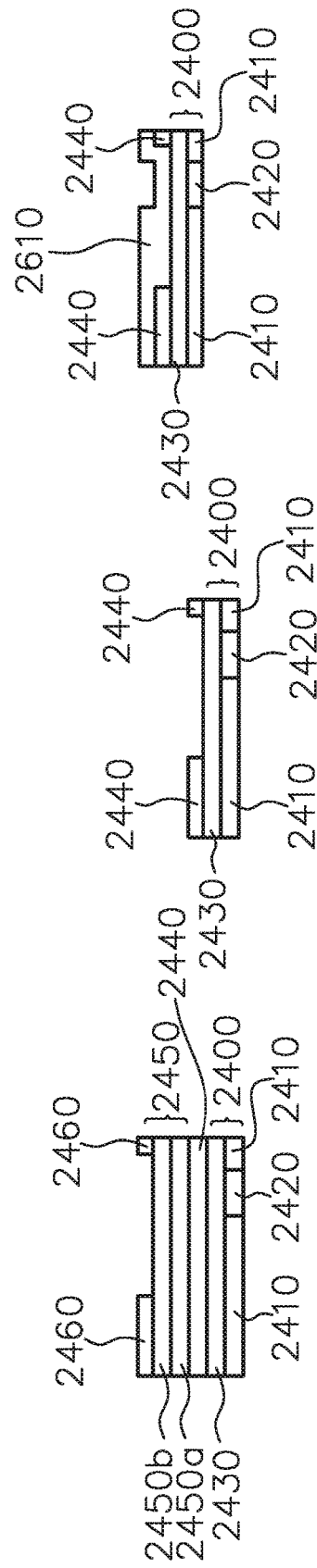
Fig.24A Fig.24B Fig.25A Fig.25B Fig.26A Fig.26B

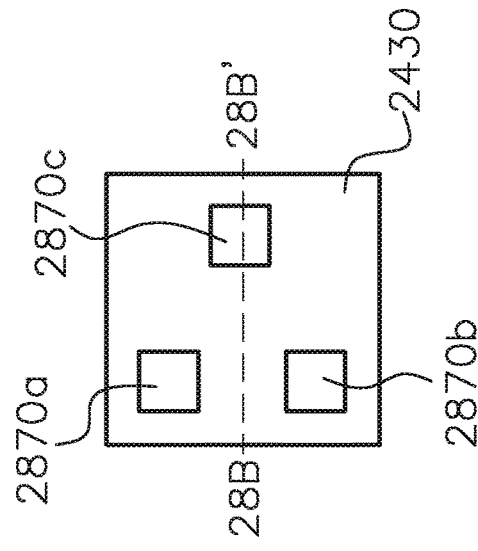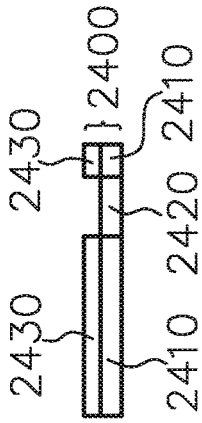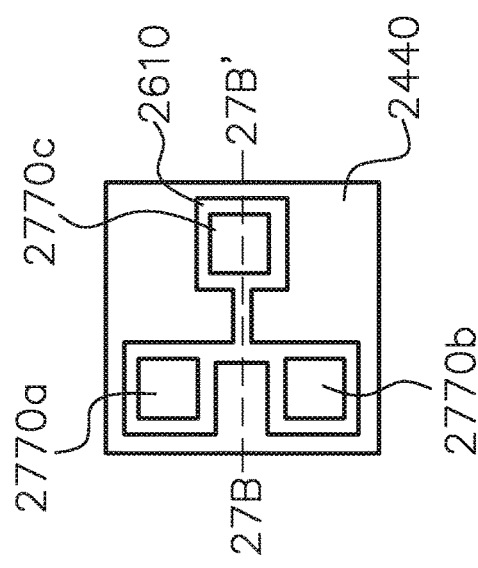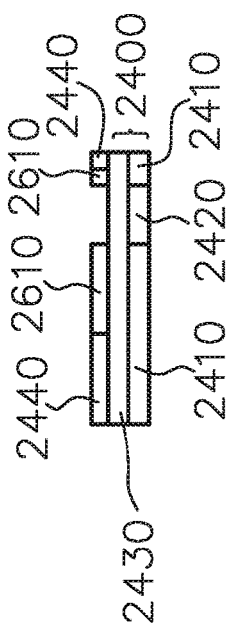
Fig. 28A
Fig. 28B
Fig. 27A
Fig. 27B

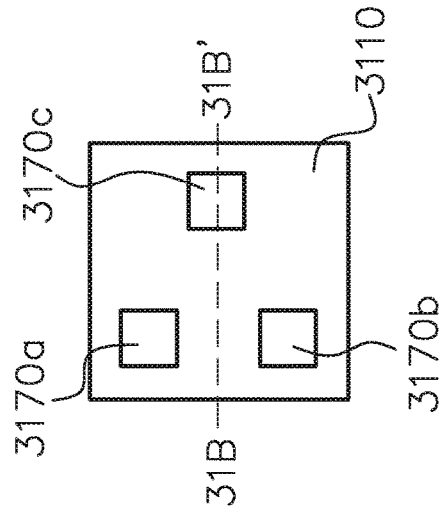
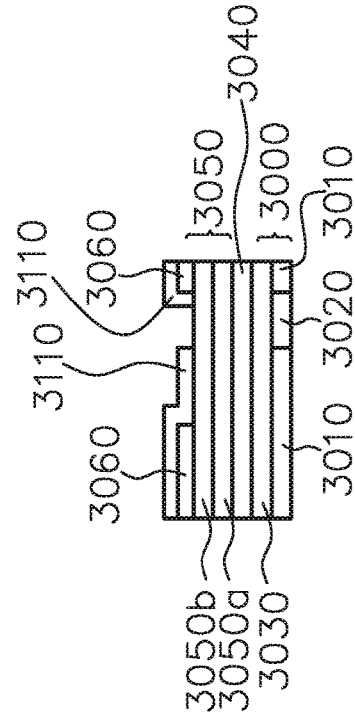
Fig.31A
Fig.31B
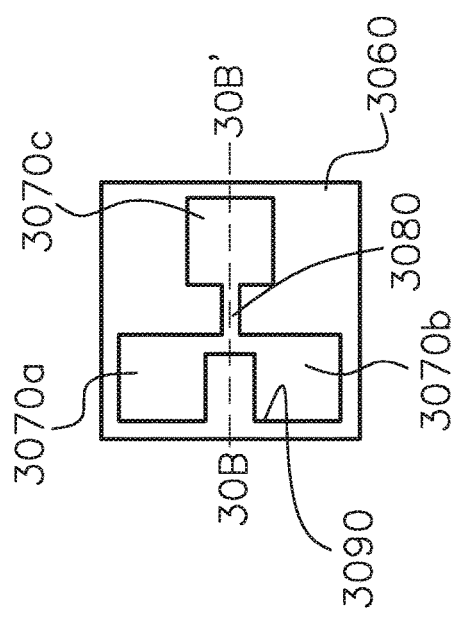
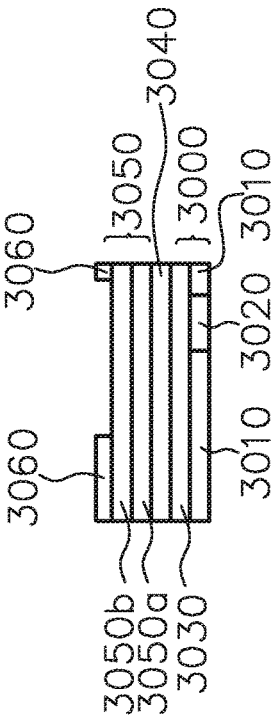
Fig.30A
Fig.30B

METHOD FOR PATTERNING INTERCONNECTS

CROSS-REFERENCE TO RELATED APPLICATIONS

This application claims the benefit of U.S. Provisional Patent Application Ser. No. 62/339,484, filed May 20, 2016, which is hereby incorporated by reference in its entirety.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. For example, a semiconductor structure typically includes a metallization layer disposed over a substrate, where the metallization layer that provides interconnections to devices (such as transistors, capacitors, resistors, and/or other active and passive devices) formed on the substrate. An inter-metal dielectric (IMD) layer disposed over the typically includes interconnects (such as vertical interconnects) connected to conducive lines of the metallization layer.

When forming the interconnects in the IMD layer, various photolithographic and etching processes are performed to form an opening (which can include one or more holes) in the IMD layer, which is subsequently filled with a conductive material. Typically, a number of holes formed in the IMD layer equals a number of photolithographic and etching operations performed on the IMD layer. For example, a two patterning, two etching (2P2E) process is typically performed to form an opening in the IMD layer that includes two holes, a three patterning, three etching (3P3E) process is typically performed to form an opening in the IMD layer that includes three holes, a four patterning, four etching (4P4E) process is typically performed to form an opening in the IMD layer that includes four holes, and so on. Such processing is not only very inefficient, but also very costly. A need therefore exists for a process that can form openings (for example, having more than one hole) in semiconductor processing layers, such as the IMD layer, in a relatively efficient and cost effective manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic sectional top view illustrating a stage in the fabrication of the semiconductor structure according to the method of FIG. 1, FIG. 2B is a schematic sectional view taken on line 2B-2B' of FIG. 2A, and FIG. 2C is a schematic sectional view taken on line 2C-2C' of FIG. 2A.

FIG. 3A is a schematic sectional top view illustrating another stage in the fabrication of the semiconductor structure according to the method of FIG. 1, FIG. 3B is a schematic sectional view taken on line 3B-3B' of FIG. 3A, and FIG. 3C is a schematic sectional view taken on line 3C-3C' of FIG. 3A.

FIG. 4A is a schematic sectional top view illustrating another stage in the fabrication of the semiconductor structure according to the method of FIG. 1, FIG. 4B is a schematic sectional view taken on line 4B-4B' of FIG. 4A, and FIG. 4C is a schematic sectional view taken on line 4C-4C' of FIG. 4A.

FIG. 5A is a schematic sectional top view illustrating another stage in the fabrication of the semiconductor structure according to the method of FIG. 1, FIG. 5B is a schematic sectional view taken on line 5B-5B' of FIG. 5A, and FIG. 5C is a schematic sectional view taken on line 5C-5C' of FIG. 5A.

FIG. 6A is a schematic sectional top view illustrating another stage in the fabrication of the semiconductor structure according to the method of FIG. 1, FIG. 6B is a schematic sectional view taken on line 6B-6B' of FIG. 6A, and FIG. 6C is a schematic sectional view taken on line 6C-6C' of FIG. 6A.

FIG. 8A is a schematic sectional top view illustrating a stage in the fabrication of the semiconductor structure according to the method of FIG. 7, FIG. 8B is a schematic sectional view taken on line 8B-8B' of FIG. 8A, and FIG. 8C is a schematic sectional view taken on line 8C-8C' of FIG. 8A.

FIG. 9A is a schematic sectional top view illustrating another stage in the fabrication of the semiconductor structure according to the method of FIG. 7, FIG. 9B is a schematic sectional view taken on line 9B-9B' of FIG. 9A, and FIG. 9C is a schematic sectional view taken on line 9C-9C' of FIG. 9A.

FIG. 10A is a schematic sectional top view illustrating another stage in the fabrication of the semiconductor structure according to the method of FIG. 7, FIG. 10B is a schematic sectional view taken on line 10B-10B' of FIG. 10A, and FIG. 10C is a schematic sectional view taken on line 10C-10C' of FIG. 10A.

FIG. 11A is a schematic sectional top view illustrating another stage in the fabrication of the semiconductor structure according to the method of FIG. 7, FIG. 11B is a schematic sectional view taken on line 11B-11B' of FIG. 11A, and FIG. 11C is a schematic sectional view taken on line 11C-11C' of FIG. 11A.

FIG. 13A is a schematic sectional top view illustrating another stage in the fabrication of the semiconductor structure according to the method of FIG. 13, FIG. 13B is a schematic sectional view taken on line 13B-13B' of FIG. 13A, and FIG. 13C is a schematic sectional view taken on line 13C-13C' of FIG. 13A.

FIG. 14A is a schematic sectional top view illustrating another stage in the fabrication of the semiconductor structure according to the method of FIG. 12, FIG. 14B is a schematic sectional view taken on line 14B-14B' of FIG. 14A, and FIG. 14C is a schematic sectional view taken on line 14C-14C' of FIG. 14A.

FIG. 15A is a schematic sectional top view illustrating another stage in the fabrication of the semiconductor structure according to the method of FIG. 12, FIG. 15B is a schematic sectional view taken on line 15B-15B' of FIG. 15A, and FIG. 15C is a schematic sectional view taken on line 15C-15C' of FIG. 15A.

FIG. 16A is a schematic sectional top view illustrating another stage in the fabrication of the semiconductor structure according to the method of FIG. 12, FIG. 16B is a schematic sectional view taken on line 16B-16B' of FIG. 16A, and FIG. 16C is a schematic sectional view taken on line 16C-16C' of FIG. 16A.

FIG. 17A is a schematic sectional top view illustrating another stage in the fabrication of the semiconductor structure according to the method of FIG. 12, FIG. 17B is a schematic sectional view taken on line 17B-17B' of FIG. 17A, and FIG. 17C is a schematic sectional view taken on line 17C-17C' of FIG. 17A.

FIG. 19A is a schematic sectional top view illustrating another stage in the fabrication of the semiconductor structure according to the method of FIG. 18, FIG. 19B is a schematic sectional view taken on line 19B-19B' of FIG. 19A, and FIG. 19C is a schematic sectional view taken on line 19C-19C' of FIG. 19A.

FIG. 20A is a schematic sectional top view illustrating another stage in the fabrication of the semiconductor structure according to the method of FIG. 18, FIG. 20B is a schematic sectional view taken on line 20B-20B' of FIG. 20A, and FIG. 20C is a schematic sectional view taken on line 20C-20C' of FIG. 20A.

FIG. 24A is a schematic sectional top view illustrating another stage in the fabrication of the semiconductor structure according to the method of FIG. 23, and FIG. 24B is a schematic sectional view taken on line 24B-24B' of FIG. 24A.

FIG. 25A is a schematic sectional top view illustrating another stage in the fabrication of the semiconductor structure according to the method of FIG. 23, and FIG. 25B is a schematic sectional view taken on line 25B-25B' of FIG. 25A.

FIG. 26A is a schematic sectional top view illustrating another stage in the fabrication of the semiconductor structure according to the method of FIG. 23, and FIG. 26B is a schematic sectional view taken on line 26B-26B' of FIG. 26A.

FIG. 27A is a schematic sectional top view illustrating another stage in the fabrication of the semiconductor structure according to the method of FIG. 23, and FIG. 27B is a schematic sectional view taken on line 27B-27B' of FIG. 27A.

FIG. 28A is a schematic sectional top view illustrating another stage in the fabrication of the semiconductor structure according to the method of FIG. 23, and FIG. 28B is a schematic sectional view taken on line 28B-28B' of FIG. 28A.

FIG. 30A is a schematic sectional top view illustrating another stage in the fabrication of the semiconductor structure according to the method of FIG. 29, and FIG. 30B is a schematic sectional view taken on line 30B-30B' of FIG. 30A.

FIG. 31A is a schematic sectional top view illustrating another stage in the fabrication of the semiconductor structure according to the method of FIG. 29, and FIG. 31B is a schematic sectional view taken on line 31B-31B' of FIG. 31A.

DETAILED DESCRIPTION

Figure 1:
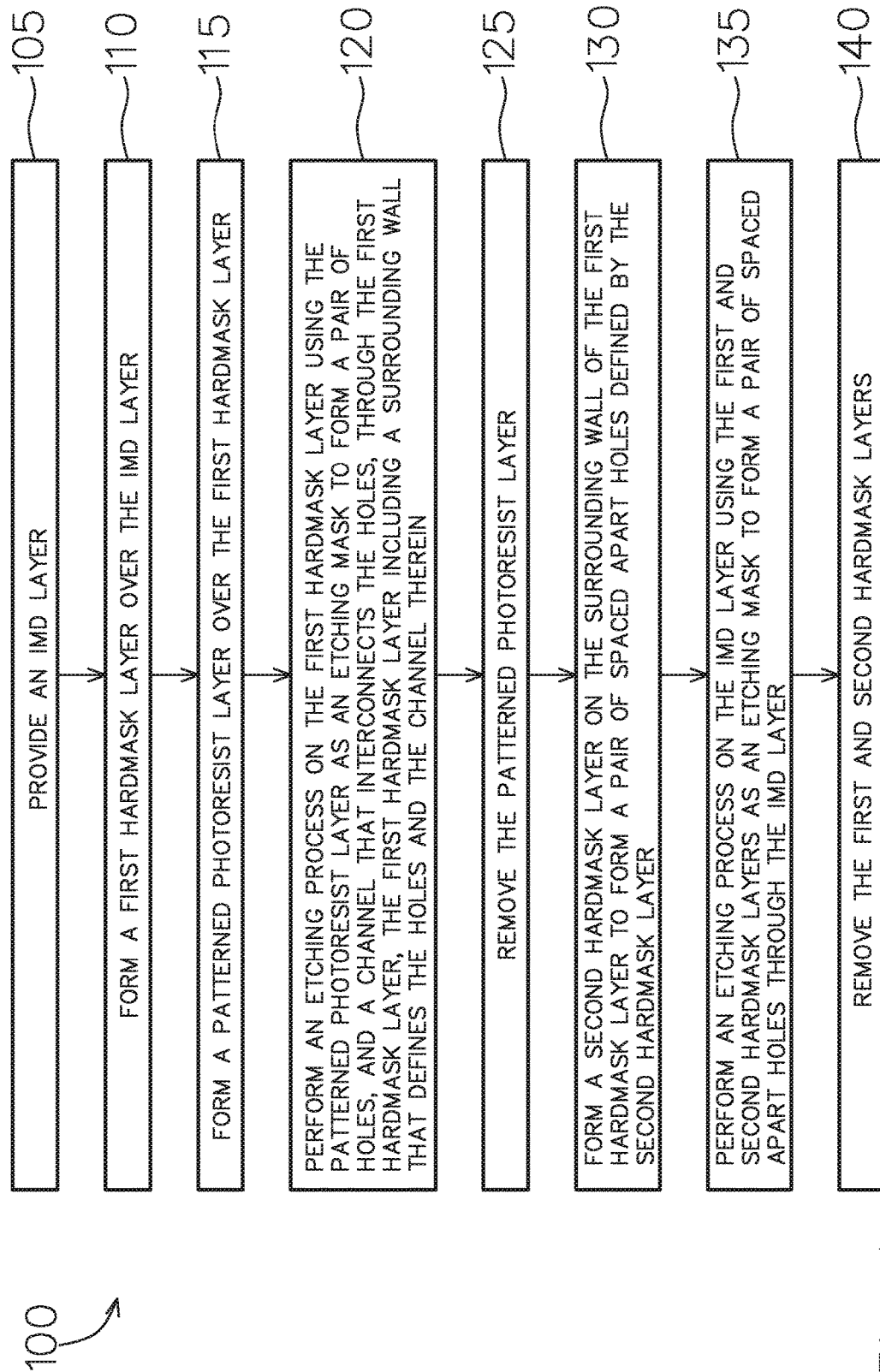
FIG. 1 is an exemplary flowchart illustrating a method for fabricating a semiconductor structure according to various aspects of the present disclosure.

The present application relates to semiconductor devices and methods for manufacturing semiconductor devices, and more particularly, to methods for patterning interconnects of semiconductor devices. Various patterning methods disclosed herein form an opening (hole) through a dielectric layer, such as an inter-metal dielectric (IMD) layer for providing interconnects for a semiconductor device, using a single photolithographic and etching operation. In some embodiments, the opening includes at least two holes extending through the dielectric layer, which are fabricated using a single photolithographic and etching operation. Such methods significantly improve efficiency and cost of manufacturing semiconductor device, which typically use more than one photolithographic and etching operation to fabricate more than one interconnect (for example, often, a number of holes formed through the dielectric layer equals a number of photolithographic and etching operations required).

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is an exemplary flowchart illustrating a method 100 for fabricating a semiconductor structure according to various aspects of the present disclosure. At block 105, an inter-metal dielectric (IMD) layer is provided. At block 110, a first hardmask layer is formed over the IMD layer. At block 115, a patterned photoresist layer is formed over the first hardmask layer. The patterned photoresist layer has an opening formed therethrough, where the opening includes a pair of holes and a channel that interconnects the holes. At block 120, an etching process is performed on the first hardmask layer using the patterned photoresist layer as an etching mask to form an opening through the first hardmask layer. The opening in the first hard mask layer includes a pair of holes and a channel that interconnects the holes. A surrounding wall (formed by the patterned first hardmask layer) defines the holes and the channel in the first hardmask layer. At block 125, the patterned photoresist layer is removed. At block 130, a second hardmask layer is formed on the surrounding wall of the first hardmask layer. The second hardmask layer has an opening that forms a pair of spaced apart holes defined in the second hardmask layer. At block 135, an etching process is performed on the IMD layer using the first hardmask layer and the second hardmask layer as an etching mask. The etching process forms an opening in the IMD layer, where the opening includes a pair of spaced apart holes that extend through the IMD layer (for example, to a metallization layer). At block 140, the first hard mask layer and the second hardmask layer are removed. Additional steps can be provided before, during, and after method 100, and some of the steps described can be moved, replaced, or eliminated for additional embodiments of method 100.

FIG. 2A is a schematic sectional top view illustrating a stage in the fabrication of an exemplary semiconductor structure 200 according to the method 100 of FIG. 1, FIG. 2B is a schematic sectional view taken on line 2B-2B' of FIG. 2A, and FIG. 2C is a schematic sectional view taken on line 2C-2C' of FIG. 2A. The semiconductor structure 200 includes a metallization layer formed over a substrate (not shown), where the metallization layer includes an insulative layer 210 and a plurality of conductive lines (for example, a conductive line 220a and a conductive line 220b). The insulative layer 210 has a top surface and a bottom surface, where conductive lines 220a, 220b extend through the insulative layer from the bottom surface to the top surface. Examples of materials for the insulative layer 210 include, but are not limited to, SiC, SiCO, SiCN, another insulative material, or a combination thereof. In some embodiments, conductive lines 220a, 220b are formed in the insulative layer 210 by forming a plurality of holes (openings) through the insulative layer 210 (for example, extending from the top surface to the bottom surface of the insulative layer 210), and filling the holes in the insulative layer 210 (for example, by a sputtering process) with a conductive material, whereby the conductive material forms the conductive lines 220a, 220b. Examples of conductive material include, but are not limited to, Al, Cu, Ni, another metal material, polysilicon, or a combination thereof. In some embodiments, the conductive lines 220a, 220b are metal lines or poly lines, depending on design requirements for semiconductor structure 200. The conductive lines 220a, 220b are used to interconnect devices (for example, transistors, resistors, capacitors, diodes, and/or other active and/or passive devices) underlying the metallization layer.

An inter-metal dielectric (IMD) layer 230 is disposed over the metallization layer (here, insulative layer 210 and the conductive lines 220a, 220b). The IMD layer 230 is formed by a suitable deposition process, such as a chemical vapor deposition (CVD) process, a physical vapor deposition (PVD) process, an atomic layer deposition (ALD) process, another deposition process, a derivative thereof, or a combination thereof. The IMD layer 230 may be formed of low-k dielectric materials, such as carbon-containing low-k dielectric materials, which may further include silicon, oxygen, nitrogen, or a combination thereof.

As shown in FIG. 2B and FIG. 2C, a first hardmask layer 240 and a tri-layer resist stack 250 are formed in succession over the IMD layer 230. The first hardmask layer 240 is formed using a suitable deposition process. The deposition process is a CVD process, a PVD process, an ALD process, another deposition process, a derivative thereof, or a combination thereof. Examples of materials for the first hardmask layer 240 include, but are not limited to, SiN, SiCN, SiC, $SiO_x$, TiN, TiO, TaN, or a combination thereof. The tri-layer resist stack 250 includes a bottom layer 250a, a middle layer 250b, and a patterned photoresist layer 260. In some embodiments, the bottom layer 250a is an organic film, and the middle layer 250b is a spin-on glass (SOG) layer. In some embodiments, the bottom layer 250a is deposited by a spin-on process over the first hardmask layer 240 to provide, for example, anti-reflective properties and etch-stop functionality. In some embodiments, the middle layer 250b is formed by depositing (for example, by a spin-on process) $SiO_2$ over the bottom layer 250a.

An opening is formed through the patterned photoresist layer 260. In FIG. 2A, the opening has a generally peanut-shaped cross section. The opening includes a pair of holes (a hole 270a and a hole 270b) and a channel 280 that interconnects the hole 270a and the hole 270b. A surrounding wall 290 (defined by the patterned photoresist layer 260) defines the holes 270a, 270b and the channel 280 in the patterned photoresist layer 260. In some embodiments, the holes 270a, 270b in the patterned photoresist layer 260 have a hole pitch of about 300 Angstroms (Å) to about 1,000 Å and a hole width of about 200 Å to about 800 Å. In some embodiments, the channel 280 in the patterned photoresist layer 260 has a channel width of about 100 Å to about 500 Å. The patterned photoresist layer 260 is formed using a lithographic process. The lithographic process includes coating (for example, spin-on coating), soft baking, mask aligning, exposure, post exposure baking, developing, rinsing, drying (for example, hard baking), and other processes. Following the formation of the patterned photoresist layer 260, an after-development inspection (ADI) process can be performed, in which the patterned photoresist layer 260 is inspected for defects. If during the ADI process the patterned photoresist layer 260 is found to be defective, the patterned photoresist layer 260 is stripped, and the lithographic process is repeated to form a new patterned photoresist layer.

FIG. 3A is a schematic sectional top view illustrating another stage in the fabrication of the semiconductor structure 200 according to the method 100 of FIG. 1, FIG. 3B is a schematic sectional view taken on line 3B-3B' of FIG. 3A, and FIG. 3C is a schematic sectional view taken on line 3C-3C' of FIG. 3A. In FIGS. 3A-3C, the opening in patterned photoresist layer 260 is transferred to the first hardmask layer 240. For example, an opening is formed through the first hardmask layer 240. In FIG. 3A, the opening has a generally peanut-shaped cross section. The opening includes a pair of holes (a hole 370a and a hole 370b) and a channel 380 that interconnects the hole 370a and the hole 370b. A surrounding wall 390 (defined by the patterned first hardmask layer 240) defines the holes 370a, 370b and the channel 380 in the patterned first hardmask layer 240. In some embodiments, an etching process is performed to remove portions of the middle layer 250b, the bottom layer 250a, and the first hardmask layer 240 to expose the IMD layer 230. The etching process uses the patterned photoresist layer 260 as an etching mask. As such, the holes 370a, 370b in the patterned first hardmask layer 240 have a substantially same hole pitch and a substantially same hole width as the holes 270a, 270b in the patterned photoresist layer 260, and the channel 280 in the patterned first hardmask layer 240 has a substantially same channel width as the channel 280 in the patterned photoresist layer 260. The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 Volts (V) to about 50 V. After patterning the first hardmask layer 240 (for example, following the formation of the holes 370a, 370b and the channel 380 in the first hardmask layer 240), the tri-layer resist stack 250 is removed by a strip process. In an example, the strip process is a wet strip process and is performed using, for example, hydrofluoric acid (HF). In another example, the strip process is a dry strip process and is performed using, for example, $CH_3$ or $BF_3$.

FIG. 4A is a schematic sectional top view illustrating another stage in the fabrication of the semiconductor structure 200 according to the method 1000 of FIG. 1, FIG. 4B is a schematic sectional view taken on line 4B-4B' of FIG. 4A, and FIG. 4C is a schematic sectional view taken on line 4C-4C' of FIG. 4A. In FIGS. 4A-4C, a second hardmask layer 410 is formed over the patterned first hardmask layer 240 and the IMD layer 230. As shown in FIG. 4B and FIG. 4C, the second hardmask layer 410 is formed over the first hardmask layer 240 and the IMD layer 230 in a conformal manner. That is, the second hardmask layer 410 that is on a top surface of the first hardmask layer 240, the second hardmask layer 410 that is on the surrounding wall 390 of the first hardmask layer 240, and the second hardmask layer 410 that is on the IMD layer 230, in an exemplary embodiment, all have a substantially same thickness. In some embodiments, the second hardmask layer 410 has a thickness at least half of the channel width of the channel 380 in patterned first hardmask layer 240, and thus the second hardmask layer 410 fills the channel 380. In some embodiments, the thickness of the second hardmask layer 410 is from about 50 Å to about 400 Å. In some embodiments, the thickness of the second hardmask layer 410 is from about 5 Å to about 100 Å. The second hardmask layer 410 is formed by a suitable deposition process, such as an ALD process, a CVD process, a PVD process, another suitable deposition process, or a combination thereof. Examples of materials for the second hardmask layer 410 include, but are not limited to, SiN, SiCN, SiC, $SiO_x$, $SiCO_x$, TiN, TiO, TaN, or a combination thereof. In some embodiments, the deposition process is conducted at a temperature of about 50° C. to about 450° C.

FIG. 5A is a schematic sectional top view illustrating another stage in the fabrication of the semiconductor structure 200 according to the method 100 of FIG. 1, FIG. 5B is a schematic sectional view taken on line 5B-5B' of FIG. 5A, and FIG. 5C is a schematic sectional view taken on line 5C-5C' of FIG. 5A. In FIGS. 5A-5C, portions of second hardmask layer 410 are removed, leaving portions of the second hardmask layer 410 within the opening in patterned first hardmask layer 240. In some embodiments, the second hardmask layer 410 disposed on the top surface of the first hardmask layer 240 and the second hardmask layer 410 that is on the IMD layer 230 are removed, leaving the second hardmask layer 410 that is on the surrounding wall 390 of the first hardmask layer 240 to form an opening in the patterned second hardmask layer 410. The opening includes a pair of spaced apart holes (a hole 570a and a hole 570b). In some embodiments, the holes 570a, 570b have a substantially same hole pitch as the holes 370a, 370b in the patterned first hardmask layer 240 and a hole width less than the hole width of the holes 370a, 370b in the patterned first hardmask layer 240. In some embodiments, the holes 570a, 570b in the second hardmask layer 410 have a hole width of about 100 Å to about 700 Å. The portions of the second hardmask layer 410 (for example, on the top surface of the first hardmask layer 240 and on the IMD layer 230) are removed using an etching process (for example, an etch back process). The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 V to about 50 V.

FIG. 6A is a schematic sectional top view illustrating another stage in the fabrication of the semiconductor structure 200 according to the method 100 of FIG. 1, FIG. 6B is a schematic sectional view taken on line 6B-6B' of FIG. 6A, and FIG. 6C is a schematic sectional view taken on line 6C-6C' of FIG. 6A. In FIGS. 6A-6C, the opening in patterned second hardmask layer 410 is transferred to the IMD layer 230. For example, an opening is formed through the IMD layer 230. The opening includes a pair of spaced apart holes (a hole 670a and a hole 670b) formed through the IMD layer 230. An etching process is performed to remove portions of the IMD layer 230, forming the holes 670a, 670b that respectively expose conductive lines 220a, 220b. The etching process uses the first hardmask layer 240 and the second hardmask layer 410 as an etching mask. In some embodiments, the holes 670a, 670b in the IMD layer 230 have a substantially same hole pitch and a substantially same hole width as the holes 570a, 570b in the patterned second hardmask layer 410. After patterning the IMD layer 230 (for example, to form the holes 670a, 670b in the IMD layer 230), the first hardmask layer 240 and the second hardmask layer 410 are removed by an etching process. The etching process is a wet etch process, a dry etch process, another suitable etch process, or a combination thereof.

Following the removal of the first hardmask layer 240 and the second hardmask layer 410, the opening in the IMD layer 230 (for example, holes 670a, 670b) may be filled with a conductive material. In some embodiments, a sputtering process forms a conductive material over IMD layer 230 that fills the holes 670a, 670b. In some embodiments, the conductive material is Al, Cu, Ni, another metal material, or a combination thereof. Thereafter, a chemical mechanical planarizing (CMP) process may be performed to remove the excess conductive material, such as conductive material formed on a top surface of the IMD layer 230. The conductive material remaining in the holes 670a, 670b serves as vertical interconnects. For example, in some embodiments, the semiconductor structure 200 can include vertical interconnects formed in the IMD layer 230, such as a vertical interconnect (formed by conductive material filling the hole 670a) to conductive line 220a and a vertical interconnect (formed by conductive material filling the hole 670b) to conductive line 220b.

Figure 7:
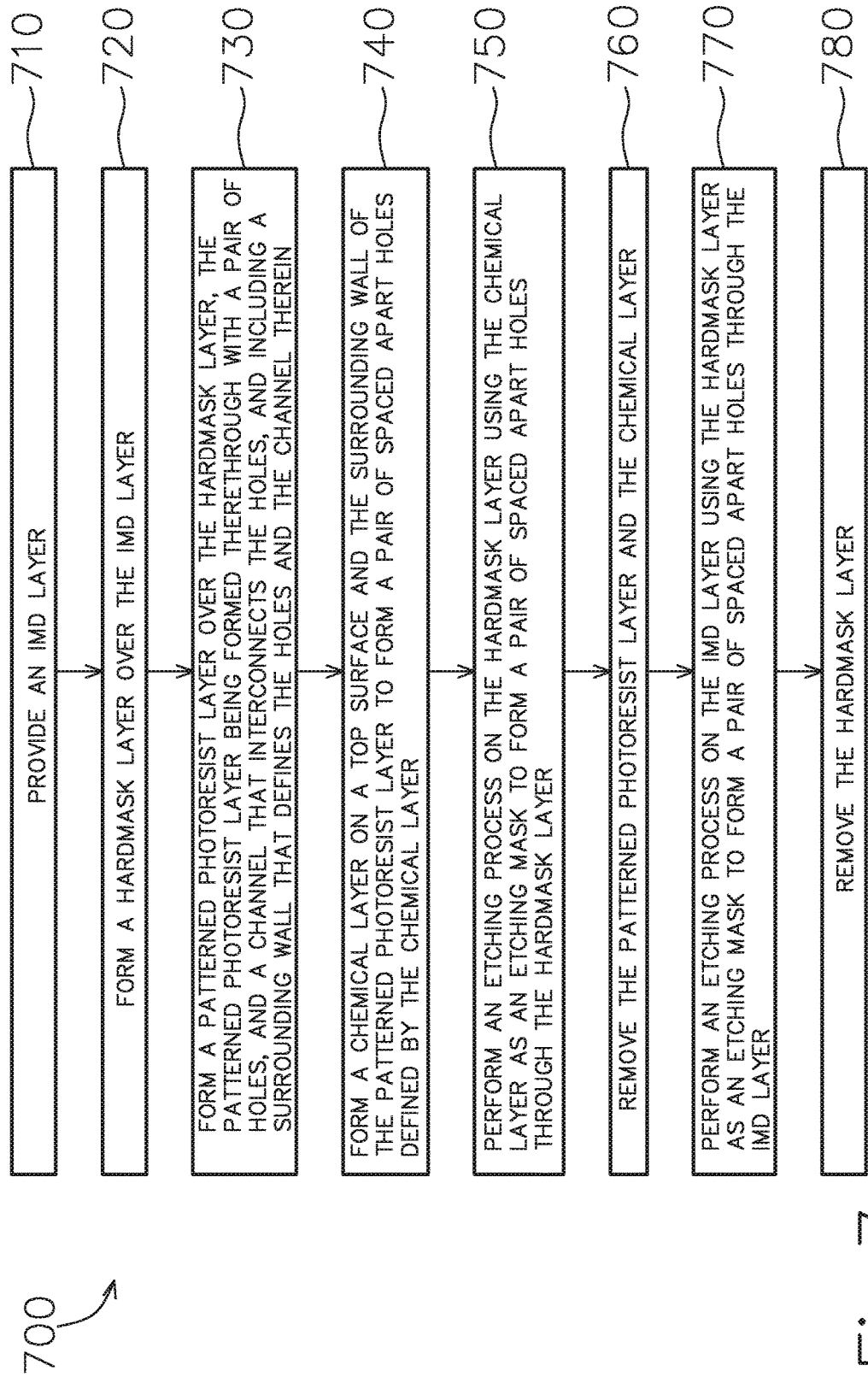
FIG. 7 is an exemplary flowchart illustrating another method for fabricating a semiconductor structure according to various aspects of the present disclosure.

FIG. 7 is another exemplary flowchart illustrating a method 700 for fabricating a semiconductor structure according to various aspects of the present disclosure. At block 710, an IMD layer is provided. At block 720, a hardmask layer is formed over the IMD layer. At block 730, a patterned photoresist layer is formed over the hardmask layer. The patterned photoresist layer includes an opening that includes a pair of holes and a channel that interconnects the holes. A surrounding wall defines the holes and the channel in the patterned photoresist layer. At block 740, a chemical layer is formed on a top surface and the surrounding wall of the patterned photoresist layer to form a pair of spaced apart holes defined thereby. At block 750, an etching process is performed on the hardmask layer using the chemical layer as an etching mask to form a pair of spaced apart holes through the hardmask layer. At block 760, the patterned photoresist layer and the chemical layer are removed. At block 770, an etching process is performed on the IMD layer using the hardmask layer as an etching mask to form a pair of spaced apart holes through the IMD layer. At block 780, the hardmask layer is removed. Additional steps can be provided before, during, and after method 700, and some of the steps described can be moved, replaced, or eliminated for additional embodiments of method 700.

FIG. 8A is a schematic sectional top view illustrating a stage in the fabrication of an exemplary semiconductor structure 800 according to the method 700 of FIG. 7, FIG. 8B is a schematic sectional view taken on line 8B-8B' of FIG. 8A, and FIG. 8C is a schematic sectional view taken on line 8C-8C' of FIG. 8A. The semiconductor structure 800 includes a metallization layer formed over a substrate (not shown), where the metallization layer includes an insulative layer 810 and a plurality of conductive lines (for example, a conductive line 820a and a conductive line 820b). The insulative layer 810 has a top surface and a bottom surface, where conductive lines 820a, 820b extend through the insulative layer from the bottom surface to the top surface. Examples of materials for the insulative layer 810 include, but are not limited to, SiC, SiCO, SiCN, another insulative material, or a combination thereof. In some embodiments, conductive lines 820a, 820b are formed in the insulative layer 810 by forming a plurality of holes (openings) through the insulative layer 810 (for example, extending from the top surface to the bottom surface of the insulative layer 810), and filling the holes in the insulative layer 810 (for example, by a sputtering process) with a conductive material, whereby the conductive material forms the conductive lines 820a, 820b. Examples of conductive material include, but are not limited to, Al, Cu, Ni, another metal material, polysilicon, or a combination thereof. In some embodiments, the conductive lines 820a, 820b are metal lines or poly lines, depending on design requirements for semiconductor structure 800. The conductive lines 820a, 820b are used to interconnect devices (for example, transistors, resistors, capacitors, diodes, and/or other active and/or passive devices) underlying the metallization layer.

An inter-metal dielectric (IMD) layer 830 is disposed over the metallization layer (here, the insulative layer 810 and the conductive lines 820a, 820b). The IMD layer 830 is formed by a suitable deposition process, such as a chemical vapor deposition (CVD) process, a physical vapor deposition (PVD) process, an atomic layer deposition (ALD) process, another deposition process, a derivative thereof, or a combination thereof. The IMD layer 830 may be formed of low-k dielectric materials, such as carbon-containing low-k dielectric materials, which may further include silicon, oxygen, nitrogen, or a combination thereof.

As shown in FIG. 8B and FIG. 8C, a hardmask layer 840 and a tri-layer resist stack 850 are formed in succession over the IMD layer 830. The hardmask layer 840 is formed using a suitable deposition process, such as a CVD process, a PVD process, an ALD process, another deposition process, a derivative thereof, or a combination thereof. Examples of materials for the hardmask layer 840 include, but are not limited to, SiN, SiCN, SiC, $SiO_x$, TiN, TiO, TaN, or a combination thereof. The tri-layer resist stack 850 includes a bottom layer 850a, a middle layer 850b, and a patterned photoresist layer 860. In some embodiments, the bottom layer 850a is an organic film, and the middle layer 850b is a spin-on glass (SOG) layer. In some embodiments, the bottom layer 850a is deposited by a spin-on process over the hardmask layer 840 to provide, for example, anti-reflective properties and etch-stop functionality. In some embodiments, the middle layer 850b is formed by depositing (for example, by a spin-on process) $SiO_2$ over the bottom layer 850a.

An opening is formed through the patterned photoresist layer 860. In FIG. 8A, the opening has a generally peanut-shaped cross section. The opening includes a pair of holes (a hole 870a and a hole 870b) and a channel 880 that interconnects the hole 870a and the hole 870b. A surrounding wall 890 (defined by the patterned photoresist layer 860) defines the holes 870a, 870b and the channel 880 in the patterned photoresist layer 860. In some embodiments, the holes 870a, 870b in the patterned photoresist layer 860 have a hole pitch of about 300 Å to about 1,000 Å and a hole width of about 200 Å to about 800 Å. In some embodiments, the channel 880 in the patterned photoresist layer 860 has a channel width of about 100 Å to about 500 Å. The patterned photoresist layer 860 is formed using a lithographic process. The lithographic process includes coating (for example, spin-on coating), soft baking, mask aligning, exposure, post exposure baking, developing, rinsing, drying (for example, hard baking), and other processes. Following the formation of the patterned photoresist layer 860, an ADI process can be performed, in which the patterned photoresist layer 860 is inspected for defects. If during the ADI process the patterned photoresist layer 860 is found to be defective, the patterned photoresist layer 860 is stripped, and the lithographic process is repeated to form a new patterned photoresist layer.

FIG. 9A is a schematic sectional top view illustrating another stage in the fabrication of the semiconductor structure 800 according to the method 700 of FIG. 7, FIG. 9B is a schematic sectional view taken on line 9B-9B' of FIG. 9A, and FIG. 9C is a schematic sectional view taken on line 9C-9C' of FIG. 9A. In FIGS. 9A-9C, a chemical layer 910 having an opening therein is formed over the patterned photoresist layer 860. The opening includes a pair of spaced apart holes (a hole 970a and a hole 970b) defined by the chemical layer 910. For example, the chemical layer 910 is formed on exposed surfaces of the patterned photoresist layer 860, such as a top surface of the patterned photoresist layer 860 and a surface of the patterned photoresist layer 860 that defines the surrounding wall 890. In some embodiments, the holes 970a, 970b have a substantially same hole pitch as the holes 870a, 870b in the patterned photoresist layer 860. In some embodiments, the holes 970a, 970b (defined in the chemical layer 910) have a hole width less than the hole width of the holes 870a, 870b in the patterned photoresist layer 860. In some embodiments, the holes 970a, 970b have a hole width of about 100 Å to about 700 Å. In some embodiments, as depicted in FIG. 9B and FIG. 9C, the chemical layer 910 on the top surface of the patterned photoresist layer 860 has a substantially same thickness as the chemical layer 910 on the surface of the patterned photoresist layer 860 that defines the surrounding wall 890. In some embodiments, the chemical layer 910 has a thickness at least half of the channel width of the channel 880 in the patterned photoresist layer 860. In some embodiments, the thickness of the chemical layer 910 is about 50 Å to about 400 Å.

The chemical layer 910 is formed by any suitable process. In some embodiments, forming the chemical layer 910 includes: forming a shrink material over exposed portions of the tri-layer resist stack 850 (for example, over exposed portions of the patterned photoresist layer 860 and exposed portions of the middle layer 850b, such that the shrink material fills the holes 870a, 870b defined in the patterned photoresist layer 860); baking the shrink material, such that the shrink material reacts with the patterned photoresist layer 860 to form the chemical layer 910; and removing an unreacted portion of the shrink material (for example, portions of the shrink material on the middle layer 850b), such that the holes 970a, 970b are formed through the chemical layer 910. In some embodiments, the shrink material is formed over the patterned photoresist layer 860 and middle layer 850b (for example, over the holes 870a, 870b defined in the patterned photoresist layer 860) using a suitable spin-on process. In some embodiments, the shrink material is baked at a baking temperature of about 110° C. to about 170° C. In some embodiments, the shrink material is baked for about 60 seconds. The unreacted portion of the shrink material is removed using a suitable development process. In some embodiments, the development process includes a puddle development process (for example, where the unreacted portion of the shrink material is washed away with water (for example, de-ionized water (DIW) for about 60 seconds)), an immersion development process, a spray development process, another suitable development process, or a combination thereof. The shrink material includes an inorganic material (such as a dielectric material), an organic material (such as a polymeric material), or a combination thereof. In some embodiments, an example of a water soluble organic material that may be used as the shrink material is commercially available from Dow Chemical Corporation or JSR Corporation. In some embodiments, the shrink material is a topaz-type material, such as that commercially available from Applied Materials, Santa Clara, Calif. In some embodiments, the shrink material is an inter-mixing type polymer.

FIG. 10A is a schematic top view illustrating another stage in the fabrication of the semiconductor structure 800 according to the method 700 of FIG. 7, FIG. 10B is a schematic sectional view taken on line 10B-10B' of FIG. 10A, and FIG. 10C is a schematic sectional view taken on line 10C-10C' of FIG. 10A. In FIGS. 10A-10C, the opening in patterned chemical layer 910 is transferred to the hardmask layer 840. For example, an opening is formed through the hardmask layer 840. In FIG. 10A, the opening includes a pair of space apart holes (a hole 1070a and a hole 1070b). In some embodiments, an etching process is performed to remove portions of the middle layer 850b, the bottom layer 850a, and the hardmask layer 840 to expose the IMD layer 830. The etching process uses the patterned chemical layer 910 as an etching mask. As such, the holes 1070a, 1070b in the patterned hardmask layer 840 have a substantially same hole pitch and a substantially same hole width as the holes 970a, 970b in the chemical layer 910. The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 V to about 50 V. After patterning the hardmask layer 840 (for example, following the formation of the holes 1070a, 1070b in the hardmask layer 840), the tri-layer resist stack 850 is removed by a strip process, thereby removing the chemical layer 910. In an example, the strip process is a wet strip process and is performed using, for example, hydrofluoric acid (HF). In another example, the strip process is a dry strip process and is performed using, for example, $CH_3$ or $BF_3$.

FIG. 11A is a schematic top view illustrating another stage in the fabrication of the semiconductor structure 800 according to the method 700 of FIG. 7, FIG. 11B is a schematic sectional view taken on line 11B-11B' of FIG. 11A, and FIG. 11C is a schematic sectional view taken on line 11C-11C' of FIG. 11A. In FIGS. 11A-11C, the opening in patterned hardmask layer 840 is transferred to the IMD layer 830. For example, an opening is formed through the IMD layer 830. The opening includes a pair of spaced apart holes (a hole 1170a and a hole 1170b) formed through the IMD layer 830. An etching process is performed to remove portions of the IMD layer 830, forming the holes 1170a, 1170b that respectively expose conductive lines 820a, 820b. The etching process uses the hardmask layer 840 as an etching mask. In some embodiments, the holes 1170a, 1170b in the IMD layer 830 have a substantially same hole pitch and a substantially same hole width as the holes 1070a, 1070b in the patterned hardmask layer 840. After patterning the IMD layer 830 (for example, to form the holes 1170a, 1170b in the IMD layer 830), the hardmask layer 840 is removed by an etching process. The etching process is a wet etch process, a dry etch process, another suitable etch process, or a combination thereof.

Following the removal of the hardmask layer 840, the opening in the IMD layer 830 (for example, holes 1170a, 1170b) may be filled with a conductive material. In some embodiments, a sputtering process forms a conductive material over the IMD layer 830 that fills the holes 1170a, 1170b. In some embodiments, the conductive material is Al, Cu, Ni, another metal material, or a combination thereof. Thereafter, a chemical mechanical planarizing (CMP) process may be performed to remove the excess conductive material, such as conductive material formed on a top surface of the IMD layer 830. The conductive material remaining in the holes 1170a, 1170b serves as vertical interconnects. For example, in some embodiments, the semiconductor structure 800 can include vertical interconnects formed in the IMD layer 830, such as a vertical interconnect (formed by conductive material filling the hole 1170a) to conductive line 820a and a vertical interconnect (formed by conductive material filling the hole 1170b) to conductive line 820b.

Figure 12:
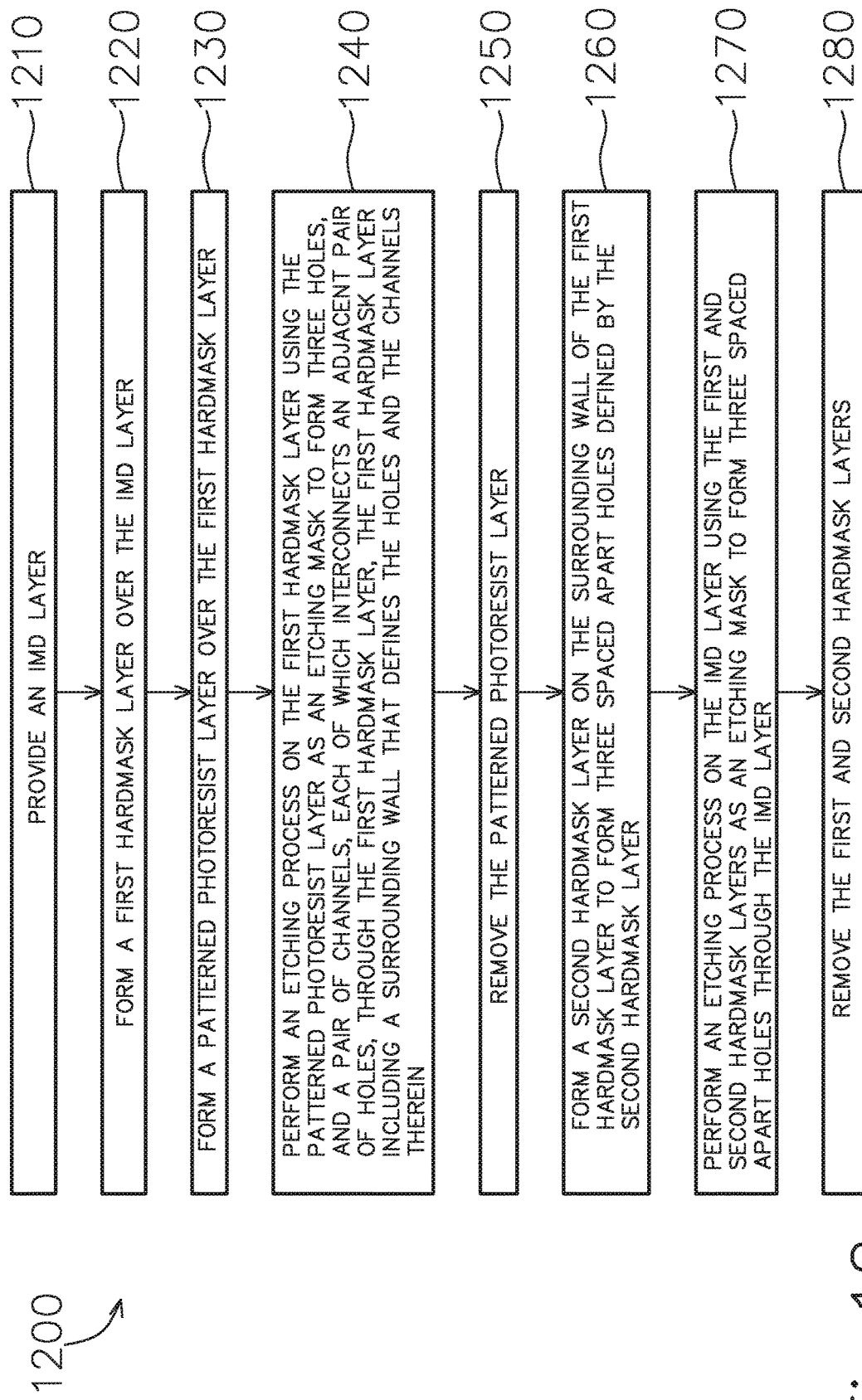
FIG. 12 is an exemplary flowchart illustrating yet another method for fabricating a semiconductor structure according to various aspects of the present disclosure.

FIG. 12 is another exemplary flowchart illustrating a method 1200 for fabricating a semiconductor structure according to various aspects of the present disclosure. At block 1210, an IMD layer is provided. At block 1220, a first hardmask layer is formed over the IMD layer. At block 1230, a patterned photoresist layer is formed over the first hardmask layer. The patterned photoresist layer has an opening formed therethrough, where the opening includes three holes and a pair of channels, each of which interconnects an adjacent pair of the holes. At block 1240, an etching process is performed on the first hardmask layer using the patterned photoresist layer as an etching mask to form an opening in through the first hardmask layer. The opening in the first hardmask layer includes three holes and a pair of channels, each of which interconnects an adjacent pair of the holes. A surrounding wall (formed by the patterned first hardmask layer) defines the holes and the channels in the first hardmask layer. At block 1250, the patterned photoresist layer is removed. At block 1260, a second hardmask layer is formed on the surrounding wall of the first hardmask layer. The second hardmask layer has an opening the forms three spaced apart holes defined in the second hardmask layer. At block 1270, an etching process is performed on the IMD layer using the first hardmask and the second hardmask layer as an etching mask. The etching process forms an opening in the IMD layer, where the opening includes three spaced apart holes that extend through the IMD layer (for example, to a metallization layer). At block 1280, the first hard mask layer and the second hardmask layer are removed. Additional steps can be provided before, during, and after method 1200, and some of the steps described can be moved, replaced, or eliminated for additional embodiments of method 1200.

FIG. 13A is a schematic sectional top view illustrating a stage in the fabrication of an exemplary semiconductor structure 1300 according to the method 1200 of FIG. 12, FIG. 13B is a schematic sectional view taken on line 13B-13B' of FIG. 13A, and FIG. 13C is a schematic sectional view taken on line 13C-13C' of FIG. 13A. The semiconductor structure 1300 includes a metallization layer formed over a substrate (not shown), where the metallization layer includes an insulative layer 1310 and a plurality of conductive lines (for example, a conductive line 1320a, a conductive line 1320b, and a conductive line 1320b). The insulative layer 1310 has a top surface and a bottom surface, where conductive lines 1320a, 1320b extend through the insulative layer from the bottom surface to the top surface. Examples of materials for the insulative layer 1310 include, but are not limited to, SiC, SiCO, SiCN, another insulative material, or a combination thereof. In some embodiments, conductive lines 1320a, 1320b, 1320c are formed in the insulative layer 1310 by forming a plurality of holes (openings) through the insulative layer 1310 (for example, extending from the top surface to the bottom surface of the insulative layer 1310), and filling the holes in the insulative layer 1310 (for example, by a sputtering process) with a conductive material, whereby the conductive material forms the conductive lines 1320a, 1320b, 1320c. Examples of conductive material include, but are not limited to, Al, Cu, Ni, another metal material, polysilicon, or a combination thereof. In some embodiments, the conductive lines 1320a, 1320b, 1320c are metal lines or poly lines, depending on design requirements for semiconductor structure 1300. The conductive lines 1320a, 1320b, 1320c are used to interconnect devices (for example, transistors, resistors, capacitors, diodes, and/or other active and/or passive devices) underlying the metallization layer.

An inter-metal dielectric (IMD) layer 1330 is disposed over the metallization layer (here, insulative layer 1310 and the conductive lines 1320a, 1320b, 1320c). The IMD layer 1330 is formed by a suitable deposition process, such as a CVD process, a PVD process, an ALD process, another deposition process, a derivative thereof, or a combination thereof. The IMD layer 1330 may be formed of low-k dielectric materials, such as carbon-containing low-k dielectric materials, which may further include silicon, oxygen, nitrogen, or a combination thereof.

As shown in FIG. 13B and FIG. 13C, a first hardmask layer 1340 and a tri-layer resist stack 1350 are formed in succession over the IMD layer 1330. The first hardmask layer 1340 is formed using a suitable deposition process. The deposition process is a CVD process, a PVD process, an ALD process, another deposition process, a derivative thereof, or a combination thereof. Examples of materials for the first hardmask layer 1340 include, but are not limited to, SiN, SiCN, SiC, $SiO_x$, TiN, TiO, TaN, or a combination thereof. The tri-layer resist stack 1350 includes a bottom layer 1350a, a middle layer 1350b, and a patterned photoresist layer 1360. In some embodiments, the bottom layer 1350a is an organic film, and the middle layer 250b is a spin-on glass (SOG) layer. In some embodiments, the bottom layer 1350a is deposited by a spin-on process over the first hardmask layer 1340 to provide, for example, anti-reflective properties and etch-stop functionality. In some embodiments, the middle layer 250b is formed by depositing (for example, by a spin-on process) $SiO_2$ over the bottom layer 250a.

An opening is formed through the patterned photoresist layer 1360. In FIG. 13A, the opening includes three holes (a hole 1370a, a hole 1370b, and a hole 1370c) sequentially disposed along a length of the patterned photoresist layer 1360, where a channel 1380a interconnects the hole 1370a and the hole 1370b and a channel 1380b interconnects the hole 1370b and the hole 1370c. A surrounding wall 1390 (defined by the patterned photoresist layer 1360) defines the holes 1370a, 1370b, 1370c and the channels 1380a, 1380b in the patterned photoresist layer 1360. In some embodiments, the holes 1370a, 1370b, 1370c in the patterned photoresist layer 1360 have a hole pitch of about 300 Å to about 1,000 Å and a hole width of about 200 Å to about 800 Å. In some embodiments, the channels 1380a, 1380b in the patterned photoresist layer 1360 have a channel width of about 100 Å to about 500 Å. The patterned photoresist layer 1360 is formed using a lithographic process. The lithographic process includes coating (for example, spin-on coating), soft baking, mask aligning, exposure, post exposure baking, developing, rinsing, drying (for example, hard baking), and other processes. Following the formation of the patterned photoresist layer 1360, an ADI process can be performed, in which the patterned photoresist layer 1360 is inspected for defects. If during the ADI process the patterned photoresist layer 1360 is found to be defective, the patterned photoresist layer 1360 is stripped, and the lithographic process is repeated to form a new patterned photoresist layer.

FIG. 14A is a schematic sectional top view illustrating another stage in the fabrication of the semiconductor structure 1300 according to the method 1200 of FIG. 12, FIG. 14B is a schematic sectional view taken on line 14B-14B' of FIG. 14A, and FIG. 14C is a schematic sectional view taken on line 14C-14C' of FIG. 14A. In FIGS. 14A-14C, the opening in patterned photoresist layer 1360 is transferred to the first hardmask layer 1340. For example, an opening is formed through the first hardmask layer 1340. In FIG. 14A, the opening includes three holes (a hole 1470a, a hole

1470b, and a hole 1470c) that are sequentially disposed along a length of the first hardmask layer 1340. A channel 1480a interconnects the hole 1470a and the hole 1470b, and a channel 1480b interconnects the hole 1470b and the hole 1470c. A surrounding wall 1490 (defined by the patterned first hardmask layer 1340) defines the holes 1470a, 1470b, 1470c and the channels 1480a, 1480b in the patterned first hardmask layer 1340. In some embodiments, an etching process is performed to remove portions of the middle layer 1350b, the bottom layer 1350a, and the first hardmask layer 1340 to expose the IMD layer 1330. The etching process uses the patterned photoresist layer 1360 as an etching mask. As such, the holes 1470a, 1470b, 1470c in the first hardmask layer 1340 have a substantially same hole pitch and a substantially same hole width as the holes 1370a, 1370b, 1370c in the patterned photoresist layer 1360, and the channels 1480a, 1480b in the first hardmask layer 1340 have a substantially same channel width as the channels 1380a, 1380b in the patterned photoresist layer 1360. The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 Volts to about 50 Volts. After patterning the first hardmask layer 1340 (for example, following the formation of the holes 1470a, 1470b, 1470c and the channels 1480a, 1480b in the first hardmask layer 1340), the tri-layer resist stack 1350 is removed by a strip process. In an example, the strip process is a wet strip process and is performed using, for example, hydrofluoric acid (HF). In another example, the strip process is a dry strip process and is performed using, for example, $CH_3$ or $BF_3$.

FIG. 15A is a schematic sectional top view illustrating another stage in the fabrication of the semiconductor structure 1300 according to the method 1200 of FIG. 12, FIG. 15B is a schematic sectional view taken on line 15B-15B' of FIG. 15A, and FIG. 15C is a schematic sectional view taken on line 15C-15C' of FIG. 15A. In FIGS. 15A-15C, a second hardmask layer 1510 is formed over the first hardmask layer 1340 and the IMD layer 1330. As shown in FIG. 15B and FIG. 15C, the second hardmask layer 1510 is formed over the first hardmask layer 1340 and the IMD layer 1330 in a conformal manner. That is, the second hardmask layer 1510 that is on a top surface of the first hardmask layer 1340, the second hardmask layer 1510 that is on the surrounding wall 1490 of the first hardmask layer 1340, and the second hardmask layer 1510 that is on the IMD layer 1330, in an exemplary embodiment, all have a substantially same thickness. In some embodiments, the second hardmask layer 1510 has a thickness at least half of the channel width of the channels 1480a, 1480b in the first hardmask layer 1340, and thus the second hardmask layer 1510 fills the channels 1480a, 1480b in the first hardmask layer 1340. In an exemplary embodiment, the thickness of the second hardmask layer 1510 is from about 50 Angstrom to about 400 Angstrom. In some embodiments, the thickness of the second hardmask layer 1510 is from about 5 Å to about 100 Å. The second hardmask layer 1510 is formed by a suitable deposition process, such as an ALD process, a CVD process, a PVD process, another suitable deposition process, or a combination thereof. Examples of materials for the second hardmask layer 1510 include, but are not limited to, SiN, SiCN, SiC, $SiO_x$, $SiCO_x$, TiN, TiO, TaN, or a combination thereof. In some embodiments, the deposition process is conducted at a temperature of about 50° C. to about 450° C.

FIG. 16A is a schematic sectional top view illustrating another stage in the fabrication of the semiconductor structure 1300 according to the method 1200 of FIG. 12, FIG. 16B is a schematic sectional view taken on line 16B-16B' of FIG. 16A, and FIG. 16C is a schematic sectional view taken on line 16C-16C' of FIG. 16A. In FIGS. 16A-16C, portions of the second hardmask layer 1510 are removed, leaving portions of the second hardmask layer 1510 within the opening in patterned first hardmask layer 1340. In some embodiments, the second hardmask layer 1510 disposed on the top surface of the first hardmask layer 1340 and the second hardmask layer 1510 that is on the IMD layer 1330 are removed, leaving the second hardmask layer 1510 that is on the surrounding wall 1490 of the first hardmask layer 1340 to form an opening in the patterned second hardmask layer 1510. The opening includes three spaced apart holes (a hole 1670a, a hole 1670b, and a hole 1670c). In some embodiments, the holes 1670a, 1670b, and 1670c have a substantially same hole pitch as the holes 1470a, 1470b, 1470c in the patterned first hardmask layer 1340 and a hole width less than the hole width of the holes 1470a, 1470b, 1470c in the patterned first hardmask layer 1340. In some embodiments, the holes 1670a, 1670b, 1670c in the second hardmask layer 1510 have a hole width of about 100 Å to about 700 Å. The portions of the second hardmask layer 1510 (for example, on the top surface of the first hardmask layer 1340 and on the IMD layer 1330) are removed using an etching process (for example, an etch back process). The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 V to about 50 V.

FIG. 17A is a schematic sectional top view illustrating another stage in the fabrication of the semiconductor structure 1300 according to the method 1200 of FIG. 12, FIG. 17B is a schematic sectional view taken on line 17B-17B' of FIG. 17A, and FIG. 17C is a schematic sectional view taken on line 17C-17C' of FIG. 17A. In FIGS. 17A-17C, the opening in patterned second hardmask layer 1510 is transferred to the IMD layer 1330. For example, an opening is formed through the IMD layer 1330. The opening includes three spaced apart holes (a hole 1770a, a hole 1770b, and a hole 1770c) formed through the IMD layer 1330. In some embodiments, the holes 1770a, 1770b, 1770c in the IMD layer 1330 are disposed, such that centers thereof are substantially collinear. An etching process is performed to remove portions of the IMD layer 1330, forming the holes 1770a, 1770b, 1770c that respectively expose conductive lines 1320a, 1320b, 1320c. The etching process uses the first hardmask layer 1340 and the second hardmask layer 1510 as an etching mask. In some embodiments, the holes 1770a, 1770b, 1770c in the IMD layer 1330 have a substantially same hole pitch and a substantially same hole width as the holes 1670a, 1670b, 1670c in the patterned second hardmask layer 1510. After patterning the IMD layer 1330 (for example, to form the holes 1770a, 1770b, 1770c in the IMD layer 1330), the first hardmask layer 1340 and the second hardmask layer 1510 are removed by an etching process. The etching process is a wet etch process, a dry etch process, another suitable etch process, or a combination thereof.

Following the removal of the first hardmask layer 1340 and the second hardmask layer 1510, the opening in the IMD layer 1330 (for example, holes 1770*a*, 1770*b*, 1770*c*) may be filled with a conductive material. In some embodiments, a sputtering process forms a conductive material over IMD layer 1330 that fills the holes 1770*a*, 1770*b*, 1770*c*. In some embodiments, the conductive material is Al, Cu, Ni, another metal material, or a combination thereof. Thereafter, a chemical mechanical planarizing (CMP) process may be performed to remove the excess conductive material, such as conductive material formed on a top surface of the IMD layer 1330. The conductive material remaining in the holes 1770*a*, 1770*b*, 1770*c* serves as vertical interconnects. For example, in some embodiments, the semiconductor structure 1300 can include vertical interconnects formed in the IMD layer 1330, such as a vertical interconnect (formed by conductive material filling the hole 1770*a*) to conductive line 1320*a*, a vertical interconnect (formed by conductive material filling the hole 1770*b*) to conductive line 1320*b*, and a vertical interconnect (formed by conductive material filling the hole 1770*c*) to conductive line 1320*c*.

Figure 18:
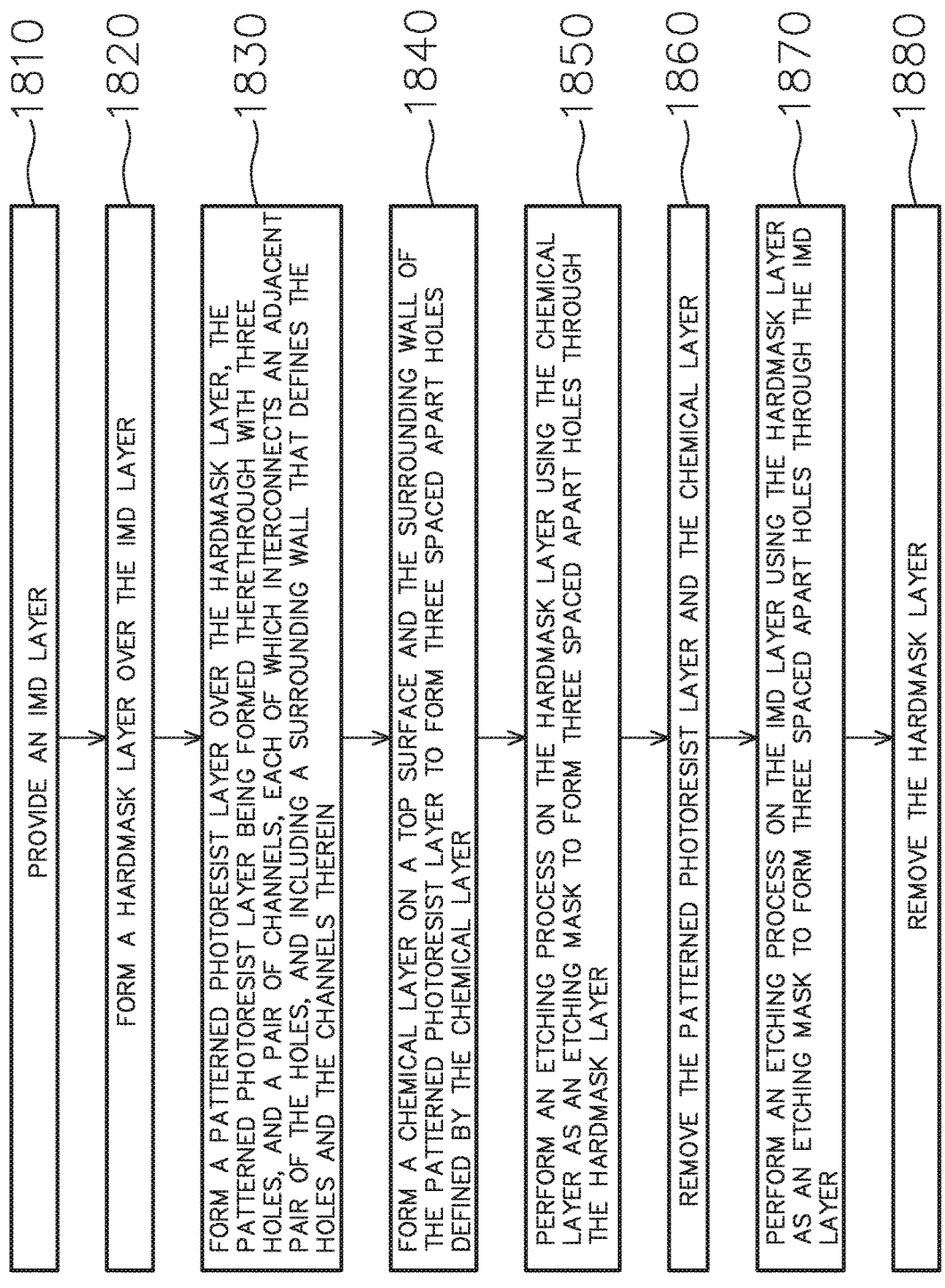
FIG. 18 is an exemplary flowchart illustrating yet another method for fabricating a semiconductor structure according to various aspects of the present disclosure.

FIG. 18 is another exemplary flowchart illustrating a method 1800 for fabricating a semiconductor structure according to various aspects of the present disclosure. At block 1810, an IMD layer is provided. At block 1820, a hardmask layer is formed over the IMD layer. At block 1830, a patterned photoresist layer is formed over the hardmask layer. The patterned photoresist layer has an opening formed therethrough, where the opening includes three holes and a pair of channels, each of which interconnects an adjacent pair of the holes. A surrounding wall (formed by the patterned photoresist layer) defines the holes and the channels in the patterned photoresist layer. At block 1840, a chemical layer is formed over the patterned photoresist layer. In some embodiments, the chemical layer is formed on a top surface of the photoresist layer and a surface of the patterned photoresist layer that forms the surrounding wall. The chemical layer has an opening that forms three spaced apart holes extending through the chemical layer. At block 1850, an etching process is performed on the hardmask layer using the chemical layer as an etching mask. The etching process forms an opening in the hardmask layer, where the opening includes three spaced apart holes. At block 1860, the patterned photoresist layer and the chemical layer are removed. At block 1870, an etching process is performed on the IMD layer using the hardmask layer as an etching mask. The etching process forms an opening in the IMD layer, where the opening includes three spaced apart holes that extend through the IMD layer (for example, to a metallization layer). At block 1880, the hardmask layer is removed. Additional steps can be provided before, during, and after method 1800, and some of the steps described can be moved, replaced, or eliminated for additional embodiments of method 1800.

FIG. 19A is a schematic sectional top view illustrating a stage in the fabrication of an exemplary semiconductor structure 1900 according to the method 1800 of FIG. 18, FIG. 19B is a schematic sectional view taken on line 19B-19B' of FIG. 19A, and FIG. 19C is a schematic sectional view taken on line 19C-19C' of FIG. 19A. The semiconductor structure 1900 includes a metallization layer formed over a substrate (not shown), where the metallization layer includes an insulative layer 1910 and a plurality of conductive lines (for example, a conductive line 1920*a* a conductive line 1920*b*, and a conductive line 1920*c*). The insulative layer 1910 has a top surface and a bottom surface, where conductive lines 1920*a*, 1920*b*, 1920*c* extend through the insulative layer from the bottom surface to the top surface. Examples of materials for the insulative layer 1910 include, but are not limited to, SiC, SiCO, SiCN, another insulative material, or a combination thereof. In some embodiments, conductive lines 1920*a*, 1920*b*, 1920*c* are formed in the insulative layer 1910 by forming a plurality of holes (openings) through the insulative layer 1910 (for example, extending from the top surface to the bottom surface of the insulative layer 1910), and filling the holes in the insulative layer 1910 (for example, by a sputtering process) with a conductive material, whereby the conductive material forms the conductive lines 1920*a*, 1920*b*, 1920*c*. Examples of conductive material include, but are not limited to, Al, Cu, Ni, another metal material, polysilicon, or a combination thereof. In some embodiments, the conductive lines 1920*a*, 1920*b*, 1920*c* are metal lines or poly lines, depending on design requirements for semiconductor structure 1900. The conductive lines 1920*a*, 1920*b*, 1920*c* are used to interconnect devices (for example, transistors, resistors, capacitors, diodes, and/or other active and/or passive devices) underlying the metallization layer.

An IMD layer 1930 is formed over the metallization layer (here, the insulative layer 1910 and the conductive lines 1920*a*, 1920*b*, 1920*c*). The IMD layer 1930 is formed by a suitable deposition process, such as a CVD process, a PVD process, an ALD process, another deposition process, a derivative thereof, or a combination thereof. The IMD layer 1930 may be formed of low-k dielectric materials, such as carbon-containing low-k dielectric materials, which may further include silicon, oxygen, nitrogen, or a combination thereof.

As shown in FIG. 19B and FIG. 19C, a hardmask layer 1940 and a tri-layer resist stack 1950 are formed in succession over the IMD layer 1930. The hardmask layer 1940 is formed using a suitable deposition process, such as a CVD process, a PVD process, an ALD process, another deposition process, a derivative thereof, or a combination thereof. Examples of materials for the hardmask layer 1940 include, but are not limited to, SiN, SiCN, SiC, $SiO_x$, TiN, TiO, TaN, or a combination thereof. The tri-layer resist stack 1950 includes a bottom layer 1950*a*, a middle layer 1950*b*, and a patterned photoresist layer 1960. In some embodiments, the bottom layer 1950*a* is an organic film, and the middle layer 1950*b* is a spin-on glass (SOG) layer. In some embodiments, the bottom layer 1950*a* is deposited by a spin-on process over the hardmask layer 1940 to provide, for example, anti-reflective properties and etch-stop functionality. In some embodiments, the middle layer 1950*b* is formed by depositing (for example, by a spin-on process) $SiO_2$ over the bottom layer 1950*a*.

An opening is formed through the patterned photoresist layer 1960. In FIG. 19A, the opening includes three holes (a hole 1970*a*, a hole 1970*b*, and a hole 1970*c*) that are sequentially disposed along the length of the patterned photoresist layer 1960, a channel 1980*a* that interconnects the hole 1970*a* and the hole 1970*b*, and a channel 1980*b* that interconnects the hole 1970*b* and the hole 1970*c*. A surrounding wall 1990 (defined by the patterned photoresist layer 1960) defines the holes 1970*a*, 1970*b*, 1970*c* and the channels 1980*a*, 1980*b* in the patterned resist layer 1960. In some embodiments, the holes 1970*a*, 1970*b*, 1970*c* in the patterned photoresist layer 1960 have a hole pitch of about 300 Å to about 1,000 Å and a hole width of about 200 Å to about 800 Å. In some embodiments, the channels 1980*a*, 1980*b* in the patterned photoresist layer 1960 have a channel width of about 100 Å to about 500 Å. The patterned photoresist layer 1960 is formed using a lithographic process. The lithographic process includes coating (for example, spin-on coating), soft baking, mask aligning, exposure, post exposure baking, developing, rinsing, drying (for example, hard baking), and other processes. Following the formation of the patterned photoresist layer 1960, an ADI process can be performed, in which the patterned photoresist layer 1960 is inspected for defects. If during the ADI process the patterned photoresist layer 1960 is found to be defective, the patterned photoresist layer 1960 is stripped, and the lithographic process is repeated to form a new patterned photoresist layer.

FIG. 20A is a schematic sectional top view illustrating another stage in the fabrication of the semiconductor structure 1900 according to the method 1800 of FIG. 18, FIG. 20B is a schematic sectional view taken on line 20B-20B' of FIG. 20A, and FIG. 20C is a schematic sectional view taken on line 20C-20C' of FIG. 20A. In FIGS. 20A-20C, a chemical layer 2010 having an opening therein is formed over the patterned photoresist layer 1960. The opening includes a pair of spaced apart holes (a hole 2070a, a hole 2070b, and a hole 2070b) defined by the chemical layer 2010. For example, the chemical layer 2010 is formed on exposed surfaces of the patterned photoresist layer 1960, such as a top surface of the patterned photoresist layer 1960 and a surface of the patterned photoresist layer 1960 that defines the surrounding wall 1990. In some embodiments, the holes 2070a, 2070b, 2070c have a substantially same hole pitch as the holes 1970a, 1970b, 1970c in the patterned photoresist layer 1960. In some embodiments, the holes 2070a, 2070b, 2070c (defined in the chemical layer 2010) have a hole width less than the hole width of the holes 1970a, 1970b, 1970c in the patterned photoresist layer 2060. In some embodiments, the holes 2070a, 2070b, 2070c have a hole width of about 100 Å to about 700 Å. In some embodiments, as depicted in FIG. 20B and FIG. 20C, the chemical layer 2010 on the top surface of the patterned photoresist layer 1960 has a substantially same thickness as the chemical layer 2010 on the surface of the patterned photoresist layer 1960 that defines the surrounding wall 1990. In some embodiments, the chemical layer 2010 has a thickness at least half of the channel width of the channels 1980a, 1980b in the patterned photoresist layer 1960. In some embodiments, the thickness of the chemical layer 2010 is about 50 Å to about 400 Å.

The chemical layer 2010 is formed by any suitable process. In some embodiments, forming the chemical layer 2010 includes: forming a shrink material over exposed portions of the tri-layer resist stack 1950 (for example, over exposed portions of the patterned photoresist layer 1960 and exposed portions of the middle layer 1950b, such that the shrink material fills the holes 1970a, 1970b, 1970c defined in the patterned photoresist layer 1960); baking the shrink material, such that the shrink material reacts with the patterned photoresist layer 1960 to form the chemical layer 2010; and removing an unreacted portion of the shrink material (for example, portions of the shrink material on the middle layer 1950b), such that the holes 2070a, 2070b, 2070c are formed through the chemical layer 2010. In some embodiments, the shrink material is formed over the patterned photoresist layer 1960 and middle layer 1950b (for example, over the holes 1970a, 1970b, 1970c defined in the patterned photoresist layer 1960) using a suitable spin-on process. In some embodiments, the shrink material is baked at a baking temperature of about 110° C. to about 170° C. In some embodiments, the shrink material is baked for about 60 seconds. The unreacted portion of the shrink material is removed using a suitable development process. In some embodiments, the development process includes a puddle development process (for example, where the unreacted portion of the shrink material is washed away with water (for example, de-ionized water (DIW) for about 60 seconds)), an immersion development process, a spray development process, another suitable development process, or a combination thereof. The shrink material includes an inorganic material (such as a dielectric material), an organic material (such as a polymeric material), or a combination thereof. In some embodiments, an example of a water soluble organic material that may be used as the shrink material is commercially available from Dow Chemical Corporation or JSR Corporation. In some embodiments, the shrink material is a topaz-type material, such as that commercially available from Applied Materials, Santa Clara, Calif. In some embodiments, the shrink material is an inter-mixing type polymer.

Figure 21A:
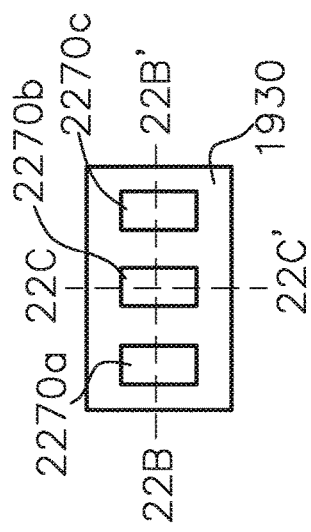
FIG. 21A is a schematic sectional top view illustrating another stage in the fabrication of the semiconductor structure according to the method of FIG. 18.
Figure 21B:
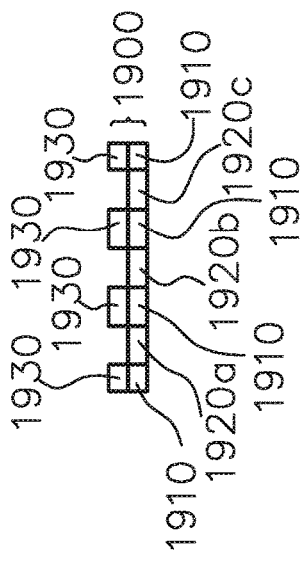
FIG. 21B is a schematic sectional view taken on line 21B-21B' of FIG. 21A.
Figure 21C:
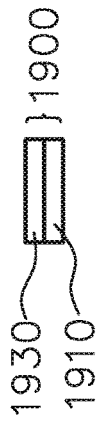
FIG. 21C is a schematic sectional view taken on line 21C-21C' of FIG. 21A.

FIG. 21A is a schematic top view illustrating another stage in the fabrication of the semiconductor structure 1900 according to the method 1800 of FIG. 18, FIG. 21B is a schematic sectional view taken on line 21B-21B' of FIG. 21A, and FIG. 21C is a schematic sectional view taken on line 21C-21C' of FIG. 21A. In FIGS. 21A-21C, the opening in patterned chemical layer 2010 is transferred to the hardmask layer 1940. For example, an opening is formed through the hardmask layer 1940. In FIG. 21A, the opening includes three spaced apart holes (a hole 2170a, a hole 2170b, and a hole 2170c). In some embodiments, an etching process is performed to remove portions of the middle layer 1950b, the bottom layer 1950a, and the hardmask layer 1940 to expose the IMD layer 1930. The etching process uses the patterned chemical layer 2010 as an etching mask. As such, the holes 2170a, 2170b, 2170c in the patterned hardmask layer 1940 have a substantially same hole pitch and a substantially same hole width as the holes 2070a, 2070b, 2070c in the chemical layer 2010. The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 V to about 50 V. After patterning the hardmask layer 1940 (for example, following the formation of the holes 2170a, 2170b, 2170c in the hardmask layer 1940), the tri-layer resist stack 1950 is removed by a strip process, thereby removing the chemical layer 2010. In an example, the strip process is a wet strip process and is performed using, for example, hydrofluoric acid (HF). In another example, the strip process is a dry strip process and is performed using, for example, $CH_3$ or $BF_3$.

Figure 22A:
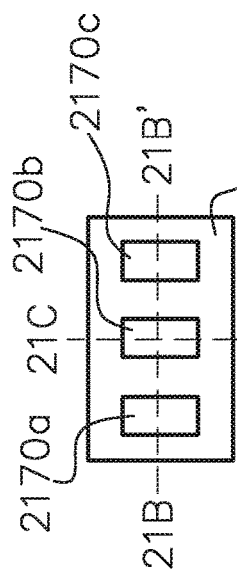
FIG. 22A is a schematic sectional top view illustrating another stage in the fabrication of the semiconductor structure according to the method of FIG. 18.
Figure 22B:
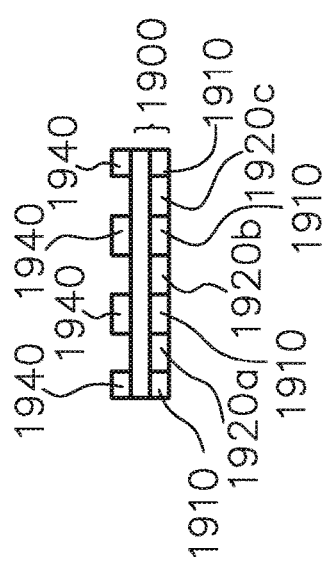
FIG. 22B is a schematic sectional view taken on line 22B-22B' of FIG. 22A.
Figure 22C:
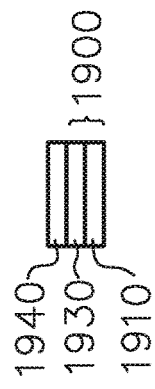
FIG. 22C is a schematic sectional view taken on line 22C-22C' of FIG. 22A.

FIG. 22A is a schematic top view illustrating another stage in the fabrication of the semiconductor structure 1900 according to the method 1800 of FIG. 18, FIG. 22B is a schematic sectional view taken on line 22B-22B' of FIG. 22A, and FIG. 22C is a schematic sectional view taken on line 22C-22C' of FIG. 22A. In FIGS. 22A-22C, the opening in patterned hardmask layer 1940 is transferred to the IMD layer 1930. For example, an opening is formed through the IMD layer 1930. The opening includes three spaced apart holes (a hole 2270a, a hole 2270b, and a hole 2270c) formed through the IMD layer 1930. In some embodiments, the holes 2270a, 2270b, 2270c in the IMD layer 1930 are disposed, such that centers thereof are substantially collinear. An etching process is performed to remove portions of the IMD layer 1930, forming the holes 2270a, 2270b, 2270c that respectively expose conductive lines 1920a, 1920b, 1920c. The etching process uses the hardmask layer 1940 as an etching mask. In some embodiments, the holes 2270a, 2270b, 2270c in the IMD layer 1930 have a substantially same hole pitch and a substantially same hole width as the holes 2170a, 2170b, 2170c in the patterned hardmask layer 1940. After patterning the IMD layer 1930 (for example, to form the holes 2270a, 2270b, 2270c in the IMD layer 1930), the hardmask layer 1940 is removed by an etching process. The etching process is a wet etch process, a dry etch process, another suitable etch process, or a combination thereof.

Following the removal of the hardmask layer 1940, the opening in the IMD layer 1930 (for example, holes 2270a, 2270b, 2270c) may be filled with a conductive material. In some embodiments, a sputtering process forms a conductive material over the IMD layer 1930 that fills the holes 2270a, 2270b, 2270c. In some embodiments, the conductive material is Al, Cu, Ni, another metal material, or a combination thereof. Thereafter, a chemical mechanical planarizing (CMP) process may be performed to remove the excess conductive material, such as conductive material formed on a top surface of the IMD layer 1930. The conductive material remaining in the holes 2270a, 2270b, 2270c serves as vertical interconnects. For example, in some embodiments, the semiconductor structure 1900 can include vertical interconnects formed in the IMD layer 1930, such as a vertical interconnect (formed by conductive material filling the hole 2270a) to conductive line 1920a, a vertical interconnect (formed by conductive material filling the hole 2270b) to conductive line 1920b, and a vertical interconnect (formed by conductive material filling the hole 2270c) to conductive line 1920c.

Figure 23:
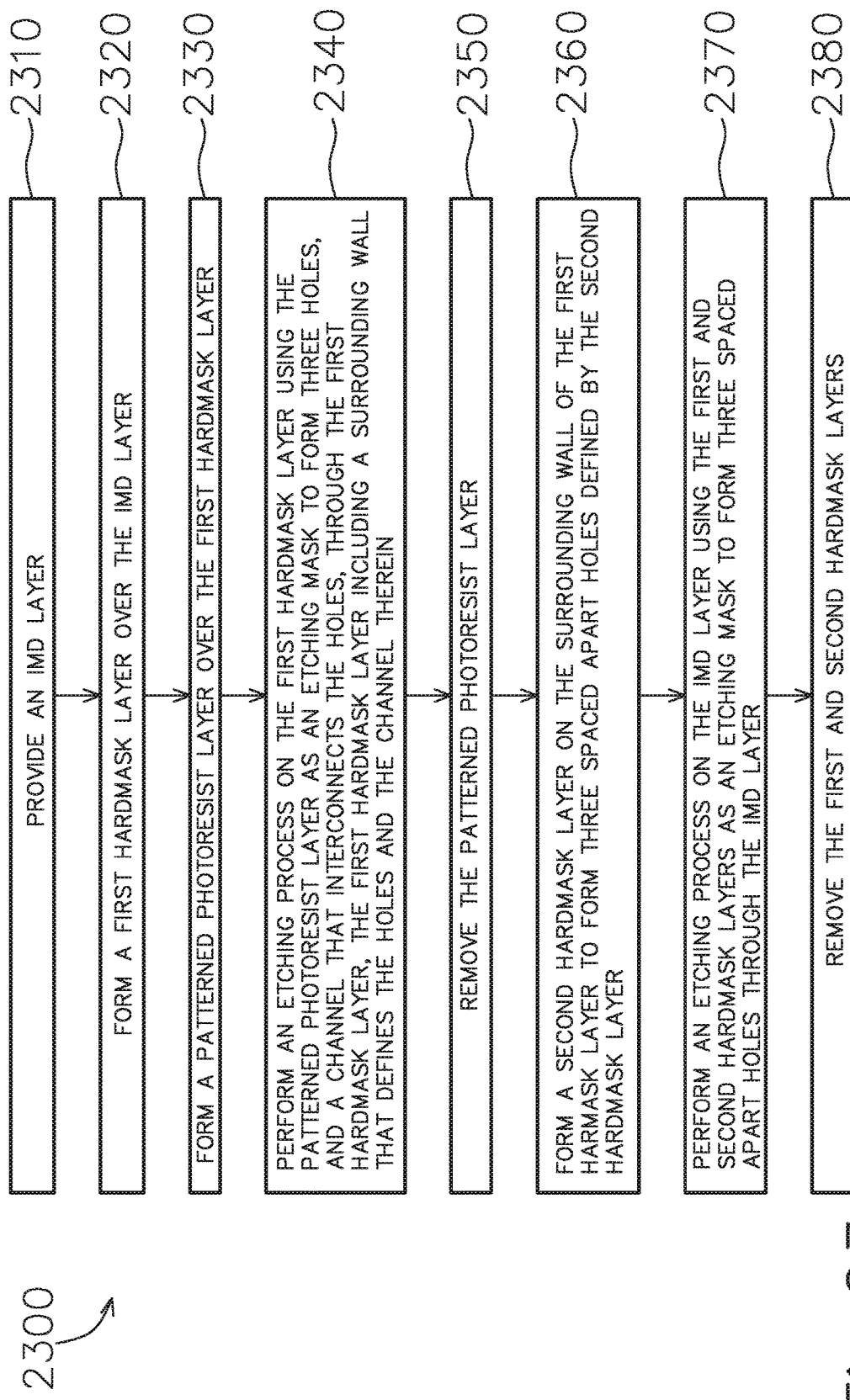
FIG. 23 is an exemplary flowchart illustrating yet another method for fabricating a semiconductor structure according to various aspects of the present disclosure.

FIG. 23 is another exemplary flowchart illustrating a method 2300 for fabricating a semiconductor structure according to various aspects of the present disclosure. At block 2310, an IMD layer is provided. At block 2320, a first hardmask layer is formed over the IMD layer. At block 2330, a patterned photoresist layer is formed over the first hardmask layer. The patterned photoresist layer has an opening formed therethrough, where the opening includes three holes and a channel that interconnects the holes. At block 2340, an etching process is performed on the first hardmask layer using the patterned photoresist layer as an etching mask. The etching process forms an opening through the first hardmask layer, where the opening includes three holes and a channel that interconnects the holes. A surrounding wall (formed by the patterned first hardmask layer) defines the holes and the channel in the first hardmask layer. At block 2350, the patterned photoresist layer is removed. At block 2360, a second hardmask layer is formed on the surrounding wall of the first hardmask layer. The second hardmask layer has an opening that forms three spaced apart holes defined in the second hardmask layer. At block 2370, an etching process is performed on the IMD layer using the first hard mask layer and the second hardmask layer as an etching mask. The etching process forms an opening in the IMD layer, where the opening includes three spaced apart holes that extend through the IMD layer (for example, to a metallization layer). At block 2380, the first hardmask layer and the second hardmask layer are removed. Additional steps can be provided before, during, and after method 2300, and some of the steps described can be moved, replaced, or eliminated for additional embodiments of method 2300.

FIG. 24A is a schematic sectional top view illustrating a stage in the fabrication of an exemplary semiconductor structure 2400 according to the method 2300 of FIG. 23, and FIG. 24B is a schematic sectional view taken on line 24B-24B' of FIG. 24A. The semiconductor structure 2400 includes a metallization layer formed over a substrate (not shown), where the metallization layer includes an insulative layer 2410 and a plurality of conductive lines (for example, conductive lines 2420). The insulative layer 2410 has a top surface and a bottom surface, where conductive lines 2420 extend through the insulative layer 2410 from the bottom surface to the top surface. Examples of materials for the insulative layer 2410 include, but are not limited to, SiC, SiCO, SiCN, another insulative material, or a combination thereof. In some embodiments, conductive lines 2420 are formed in the insulative layer 2410 by forming a plurality of holes (openings) through the insulative layer 2410 (for example, extending from the top surface to the bottom surface of the insulative layer 2410), and filling the holes in the insulative layer 2410 (for example, by a sputtering process) with a conductive material, whereby the conductive material forms the conductive lines 2420. Examples of conductive material include, but are not limited to, Al, Cu, Ni, another metal material, polysilicon, or a combination thereof. In some embodiments, the conductive lines 2420 are metal lines or poly lines, depending on design requirements for semiconductor structure 2400. The conductive lines 2420 are used to interconnect devices (for example, transistors, resistors, capacitors, diodes, and/or other active and/or passive devices) underlying the metallization layer.

An IMD layer 2430 is formed over the metallization layer (here, insulative layer 2410 and conductive lines 2420). The IMD layer 2430 is formed by a suitable deposition process, such as a CVD process, a PVD process, an ALD process, another deposition process, a derivative thereof, or a combination thereof. The IMD layer 2430 may be formed of low-k dielectric materials, such as carbon-containing low-k dielectric materials, which may further include silicon, oxygen, nitrogen, or a combination thereof.

As shown in FIG. 24B, a first hardmask layer 2440 and a tri-layer resist stack 2450 are formed in succession over the IMD layer 2430. The first hardmask layer 2440 is formed using a suitable deposition process, such as a CVD process, a PVD process, an ALD process, another deposition process, a derivative thereof, or a combination thereof. Examples of materials for the first hardmask layer 2440 include, but are not limited to, SiN, SiCN, SiC, $SiO_x$, TiN, TiO, TaN, or a combination thereof. The tri-layer resist stack 2450 includes a bottom layer 2450a, a middle layer 2450b, and a patterned photoresist layer 2460. In some embodiments, the bottom layer 2450a is an organic film, and the middle layer 2450b is a spin-on glass (SOG) layer. In some embodiments, the bottom layer 2450a is deposited by a spin-on process over the first hardmask layer 2440 to provide, for example, anti-reflective properties and etch-stop functionality. In some embodiments, the middle layer 2450b is formed by depositing (for example, by a spin-on process) $SiO_2$ over the bottom layer 2450a.

An opening is formed through the patterned photoresist layer 2460. In FIG. 24A, the opening includes three holes (a hole 2470a, a hole 2470b, and a hole 2470c) and a channel 2480 that interconnects the holes 2470a, 2470b, 2470c. A surrounding wall 2490 (defined by the patterned photoresist layer 2460) defines the holes 2470a, 2470b, 2470c and the channel 2480 in the patterned photoresist layer 2460. The channel 2480 includes a first section that interconnects the hole 2470a and the hole 2470b and a second section that interconnects the first section and the hole 2470c. In some embodiments, the holes 2470a, 2470b, 2470c in the patterned photoresist layer 2460 have a hole pitch of about 300 Å to about 1,000 Å and a hole width of about 200 Å to about 800 Å. In some embodiments, the first section and the second section of the channel 2480 in the patterned photoresist layer 2460 have a channel width of about 100 Å to about 500 Å. The patterned photoresist layer 2460 is formed using a lithographic process. The lithographic process includes coating (for example, spin-on coating), soft baking, mask aligning, exposure, post exposure baking, developing, rinsing, drying (for example, hard baking), and other processes. Following the formation of the patterned photoresist layer 2460, an ADI process can be performed, in which the patterned photoresist layer 2460 is inspected for defects. If during the ADI process the patterned photoresist layer 2460 is found to be defective, the patterned photoresist layer 2460 is stripped, and the lithographic process is repeated to form a new patterned photoresist layer.

FIG. 25A is a schematic sectional top view illustrating another stage in the fabrication of the semiconductor structure 2400 according to the method 2300 of FIG. 23, and FIG. 25B is a schematic sectional view taken on line 25B-25B' of FIG. 25A. In FIG. 25A and FIG. 25B, the opening in patterned photoresist layer 2460 is transferred to the first hardmask layer 2440. For example, an opening is formed through the first hardmask layer 2440. In FIG. 25A, the opening includes three holes (a hole 2570a, a hole 2570b, and a hole 2570c) and a channel 2580 that interconnects the holes 2570a, 2570b, 2570c. A surrounding wall 2590 (defined by the patterned first hardmask layer 2440) defines the holes 2570a, 2570b, 2570c and the channel 2580 in the patterned first hardmask layer 2440. The channel 2580 includes a first section that interconnects the hole 2570a and the hole 2570b and a second section that interconnects the first section and the hole 2570c. In some embodiments, centers of the holes 2570a, 2570b, 2570c in the first hardmask layer 2440 are disposed at vertices of a triangle. In some embodiments, an etching process is performed to remove portions of the middle layer 2450b, the bottom layer 2450a, and the first hardmask layer 2440 to expose the IMD layer 2430. The etching process uses the patterned photoresist layer 2460 as an etching mask. As such, the holes 2570a, 2570b, 2570c in the first hardmask layer 2440 have a substantially same hole pitch and a substantially same hole width as the holes 2470a, 2470b, 2470c in the patterned photoresist layer 2460, and the channel 2580 in the first hardmask layer 2440 have a substantially same channel width as the channel 2480 in the patterned photoresist layer 2460. The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 Volts to about 50 Volts. After patterning the first hardmask layer 2440 (for example, following the formation of the holes 2570a, 2570b, 2570c and the channel 2580 in the first hardmask layer 2440), the tri-layer resist stack 2450 is removed by a strip process. In an example, the strip process is a wet strip process and is performed using, for example, hydrofluoric acid (HF). In another example, the strip process is a dry strip process and is performed using, for example, $CH_3$ or $BF_3$.

FIG. 26A is a schematic sectional top view illustrating another stage in the fabrication of the semiconductor structure 2400 according to the method 2300 of FIG. 23, and FIG. 26B is a schematic sectional view taken on line 26B-26B' of FIG. 26A. In FIG. 26A and FIG. 26B, a second hardmask layer 2610 is formed over the first hardmask layer 2440 and the IMD layer 2430. As shown in FIG. 26B, the second hardmask layer 2610 is formed over the first hardmask layer 2440 and the IMD layer 2430 in a conformal manner. That is, the second hardmask layer 2610 that is on a top surface of the first hardmask layer 2440, the second hardmask layer 2610 that is on the surrounding wall 2590 of the first hardmask layer 2440, and the second hardmask layer 2610 that is on the IMD layer 2430, in an exemplary embodiment, all have a substantially same thickness. In some embodiments, the second hardmask layer 2610 has a thickness at least half of the channel width of the channel 2580 in the first hardmask layer 2440, and thus the second hardmask layer 2610 fills the channel 2580 in the first hardmask layer 2440. In an exemplary embodiment, the thickness of the second hardmask layer 2610 is from about 50 Å to about 400 Å. In some embodiments, the thickness of the second hardmask layer 1510 is from about 5 Å to about 100 Å. The second hardmask layer 2610 is formed by a suitable deposition process, such as an ALD process, a CVD process, a PVD process, another suitable deposition process, or a combination thereof. Examples of materials for the second hardmask layer 2610 include, but are not limited to, SiN, SiCN, SiC, $SiO_x$, $SiCO_x$, TiN, TiO, TaN, or a combination thereof. In some embodiments, the deposition process is conducted at a temperature of about 50° C. to about 450° C.

FIG. 27A is a schematic sectional top view illustrating another stage in the fabrication of the semiconductor structure 2400 according to the method 2300 of FIG. 23, and FIG. 27B is a schematic sectional view taken on line 27B-27B' of FIG. 27A. In FIG. 27A and FIG. 27B, portions of the second hardmask layer 2610 are removed, leaving portions of the second hardmask layer 2610 within the opening in patterned first hardmask layer 2440. In some embodiments, the second hardmask layer 2610 disposed on the top surface of the first hardmask layer 2440 and the second hardmask layer 2610 that is on the IMD layer 2430 are removed, leaving the second hardmask layer 2610 that is on the surrounding wall 2590 of the first hardmask layer 2440 to form an opening in the patterned second hardmask layer 2610. The opening includes three spaced apart holes (a hole 2770a, a hole 2770b, and a hole 2770c). In some embodiments, the holes 2770a, 2770b, and 2770c have a substantially same hole pitch as the holes 2570a, 2570b, 2570c in the patterned first hardmask layer 2440 and a hole width less than the hole width of the holes 2570a, 2570b, 2570c in the patterned first hardmask layer 2440. In some embodiments, the holes 2770a, 2770b, 2770c in the second hardmask layer 2610 have a hole width of about 100 Å to about 700 Å. The portions of the second hardmask layer 2610 (for example, on the top surface of the first hardmask layer 2440 and on the IMD layer 2430) are removed using an etching process (for example, an etch back process). The etching process is a dry etching process, another suitable anisotropic etching process, or a combination thereof. The etching process uses $SCF_4$, $CH_xF_y$, $C_4F_8$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 V to about 50 V.

FIG. 28A is a schematic sectional top view illustrating another stage in the fabrication of the semiconductor structure 2400 according to the method 2300 of FIG. 23, and FIG. 28B is a schematic sectional view taken on line 28B-28B' of FIG. 28A. In FIG. 28A and FIG. 28B, the opening in patterned second hardmask layer 2610 is transferred to the IMD layer 2430. For example, an opening is formed through the IMD layer 2430. The opening includes three spaced apart holes (a hole 2870a, a hole 2870b, and a hole 2870c) formed through the IMD layer 2430. In some embodiments, the holes 2870a, 2870b, 2870c in the IMD layer 2430 are disposed, such that centers of the holes 2870a, 2870b, 2870c are disposed at vertices of a triangle. An etching process is performed to remove portions of the IMD layer 2430, forming the holes 2870a, 2870b, 2870c that respectively expose conductive lines 2420. The etching process uses the first hardmask layer 2440 and the second hardmask layer 2610 as an etching mask. In some embodiments, the holes 2870a, 2870b, 2870c in the IMD layer 2430 have a substantially same hole pitch and a substantially same hole width as the holes 2770a, 2770b, 2770c in the patterned second hardmask layer 2610. After patterning the IMD layer 2430 (for example, to form the holes 2870a, 2870b, 2870c in the IMD layer 2430), the first hardmask layer 2440 and the second hardmask layer 2610 are removed by an etching process. The etching process is a wet etch process, a dry etch process, another suitable etch process, or a combination thereof.

Following the removal of the first hardmask layer 2440 and the second hardmask layer 2610, the opening in the IMD layer 2430 (for example, holes 2870a, 2870b, 2870c) may be filled with a conductive material. In some embodiments, a sputtering process forms a conductive material over IMD layer 2430 that fills the holes 2870a, 2870b, 2870c. In some embodiments, the conductive material is Al, Cu, Ni, another metal material, or a combination thereof. Thereafter, a chemical mechanical planarizing (CMP) process may be performed to remove the excess conductive material, such as conductive material formed on a top surface of the IMD layer 2430. The conductive material remaining in the holes 2870a, 2870b, 2870c serves as vertical interconnects. For example, in some embodiments, the semiconductor structure 2400 can include vertical interconnects formed in the IMD layer 2430, such as vertical interconnects (formed by conductive material filling the holes 2870a, 2870b, 2870c) to conductive lines 2420.

Figure 29:
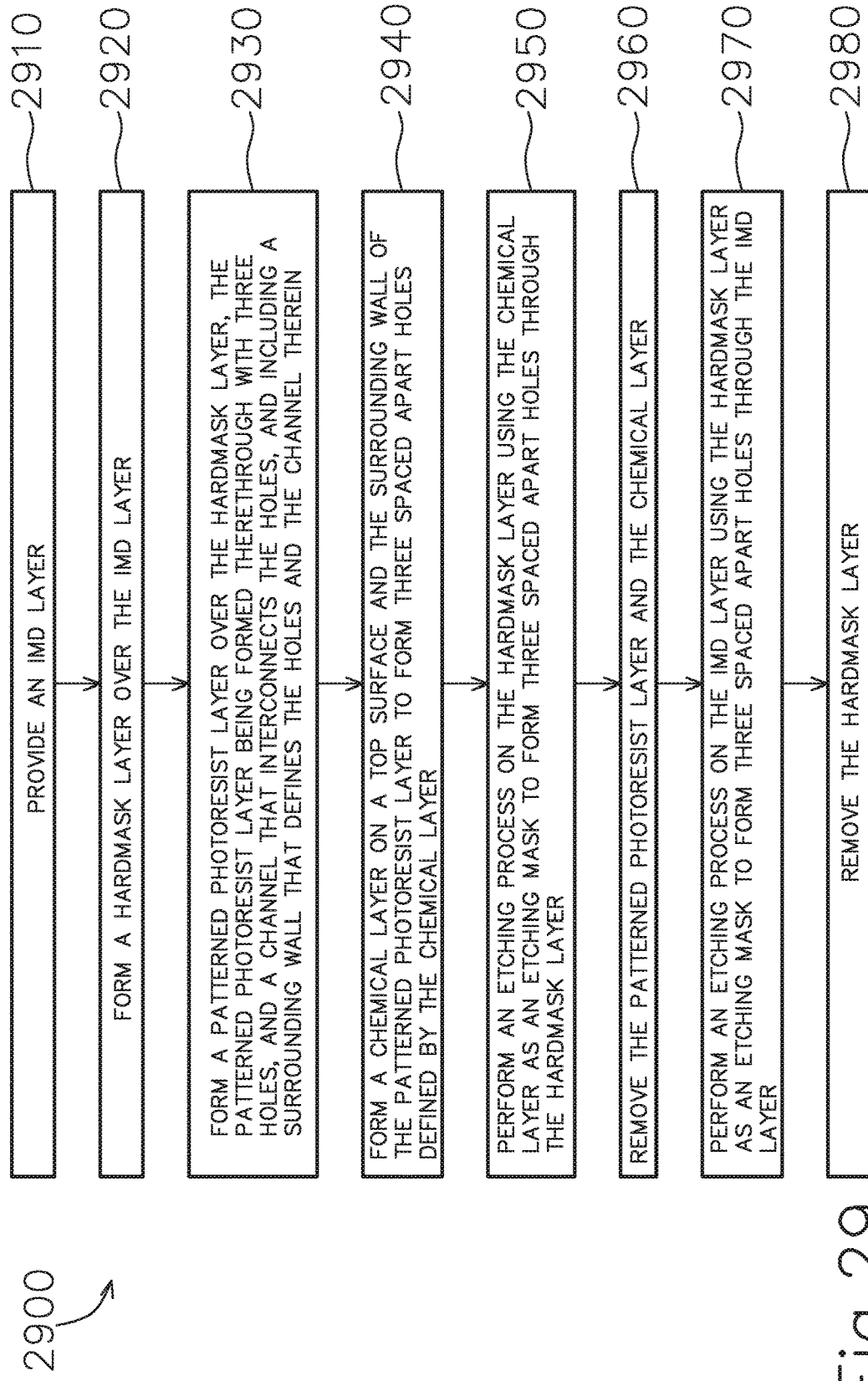
FIG. 29 is an exemplary flowchart illustrating yet another method for fabricating a semiconductor structure according to various aspects of the present disclosure.

FIG. 29 is another exemplary flowchart illustrating a method 2900 for fabricating a semiconductor device according to various aspects of the present disclosure. At block 2910, an IMD layer is provided. At 2920, a hardmask layer is formed over the IMD layer. At block 2930, a patterned photoresist layer is formed over the hardmask layer. The patterned photoresist layer has an opening formed therethrough, where the opening includes three holes and a channel that interconnects the holes. A surrounding wall (formed by the patterned photoresist layer) defines the holes and the channel in the patterned photoresist layer. At block 2940, a chemical layer is formed over the patterned photoresist layer. In some embodiments, the chemical layer is formed on a top surface of the patterned photoresist layer and a surface of the patterned photoresist layer that defines the surrounding wall. The chemical layer has an opening that includes three spaced apart holes extending through the chemical layer. At block 2950, an etching process is performed on the hardmask layer using the chemical layer as an etching mask. The etching process forms an opening through the hardmask layer, where the opening includes three spaced apart holes. At block 2960, the patterned photoresist layer and the chemical layer are removed. At block 2970, an etching process is performed on the IMD layer using the hardmask layer as an etching mask. The etching process forms an opening in the IMD layer, where the opening includes three spaced apart holes that extend through the IMD layer (for example, to a metallization layer). At 2980, the hardmask layer is removed. Additional steps can be provided before, during, and after method 2900, and some of the steps described can be moved, replaced, or eliminated for additional embodiments of method 2900.

FIG. 30A is a schematic sectional top view illustrating a stage in the fabrication of an exemplary semiconductor structure 3000 according to the method 2900 of FIG. 29, and FIG. 30B is a schematic sectional view taken on line 30B-30B' of FIG. 30A. The semiconductor structure 3000 includes a metallization layer formed over a substrate (not shown), where the metallization layer includes an insulative layer 3010 and a plurality of conductive lines (for example, conductive lines 3020). The insulative layer 3010 has a top surface and a bottom surface, where conductive lines 3020 extend through the insulative layer 3010 from the bottom surface to the top surface. Examples of materials for the insulative layer 3010 include, but are not limited to, SiC, SiCO, SiCN, another insulative material, or a combination thereof. In some embodiments, the conductive lines 3020 are formed in the insulative layer 3010 by forming a plurality of holes (openings) through the insulative layer 3010 (for example, extending from the top surface to the bottom surface of the insulative layer 3010), and filling the holes in the insulative layer 3010 (for example, by a sputtering process) with a conductive material, whereby the conductive material forms the conductive lines 3020. Examples of conductive material include, but are not limited to, Al, Cu, Ni, another metal material, polysilicon, or a combination thereof. In some embodiments, the conductive lines 3020 are metal lines or poly lines, depending on design requirements for semiconductor structure 3000. The conductive lines 3020 are used to interconnect devices (for example, transistors, resistors, capacitors, diodes, and/or other active and/or passive devices) underlying the metallization layer.

An IMD layer 3030 is formed over the metallization layer (here, insulative layer 3010 and conductive lines 3020). The IMD layer 3030 is formed by a suitable deposition process, such as a CVD process, a PVD process, an ALD process, another deposition process, a derivative thereof, or a combination thereof. The IMD layer 3030 may be formed of low-k dielectric materials, such as carbon-containing low-k dielectric materials, which may further include silicon, oxygen, nitrogen, or a combination thereof.

As shown in FIG. 30B, a hardmask layer 3040 and a tri-layer resist stack 3050 are formed in succession over the IMD layer 3030. The hardmask layer 3040 is formed using a suitable deposition process, such as a CVD process, a PVD process, an ALD process, another deposition process, a derivative thereof, or a combination thereof. Examples of materials for the hardmask layer 3040 include, but are not limited to, SiN, SiCN, SiC, SiO, TiN, TiO, TaN, or a combination thereof. The tri-layer resist stack 3050 includes a bottom layer 3050a, a middle layer 3050b, and a patterned photoresist layer 3060. In some embodiments, the bottom layer 3050a is an organic film, and the middle layer 3050b is a spin-on glass (SOG) layer. In some embodiments, the bottom layer 3050a is deposited by a spin-on process over the hardmask layer 3040 to provide, for example, anti-reflective properties and etch-stop functionality. In some embodiments, the middle layer 3050b is formed by depositing (for example, by a spin-on process) $SiO_2$ over the bottom layer 3050a.

An opening is formed through the patterned photoresist layer 3060. In FIG. 30A, the opening includes three holes (a hole 3070a, a hole 3070b, and a hole 3070c) and a channel 3080 that interconnects the holes 3070a, 3070b, 3070c. A surrounding wall 3090 (defined by the patterned photoresist layer 3060) defines the holes 3070a, 3070b, 3070c and the channel 3080 in the patterned photoresist layer 3060. The channel 3080 includes a first section that interconnects the hole 3070a and the hole 3070b and a second section that interconnects the first section and the hole 3070c. In some embodiments, the holes 3070a, 3070b, 3070c in the patterned photoresist layer 3060 have a hole pitch of about 300 Å to about 1,000 Å and a hole width of about 200 Å to about 800 Å. In some embodiments, the first section and the second section of the channel 3080 in the patterned photoresist layer 3060 have a channel width of about 100 Å to about 500 Å. The patterned photoresist layer 3060 is formed using a lithographic process. The lithographic process includes coating (for example, spin-on coating), soft baking, mask aligning, exposure, post exposure baking, developing, rinsing, drying (for example, hard baking), and other processes. Following the formation of the patterned photoresist layer 3060, an ADI process can be performed, in which the patterned photoresist layer 3060 is inspected for defects. If during the ADI process the patterned photoresist layer 3060 is found to be defective, the patterned photoresist layer 3060 is stripped, and the lithographic process is repeated to form a new patterned photoresist layer.

FIG. 31A is a schematic sectional top view illustrating another stage in the fabrication of the semiconductor structure 3000 according to the method 2900 of FIG. 29, and FIG. 31B is a schematic sectional view taken on line 31B-31B' of FIG. 31A. In FIG. 31A and FIG. 31B, a chemical layer 3110 is formed over the patterned photoresist layer 3060, such that three spaced apart holes (a hole 3170a, a hole 3170b, and a hole 3170c) are defined by the chemical layer 3110. For example, the chemical layer 3110 is formed on exposed surfaces of the patterned photoresist layer 3060, such as a top surface of the patterned photoresist layer 3060 and a surface of the patterned photoresist layer 3060 that defines the surrounding wall 3090. In some embodiments, the holes 3170a, 3170b, 3170c have a substantially same hole pitch as the holes 3070a, 3070b, 3070c in the patterned photoresist layer 3060. In some embodiments, the holes 3170a, 3170b, 3170c (defined in the chemical layer 3110) have a hole width less than the hole width of the holes 3070a, 3070b, 3070c in the patterned photoresist layer 3060. In some embodiments, the holes 3170a, 3170b, 3170c have a hole width of about 100 Å to about 700 Å. In some embodiments, as depicted in FIG. 31B, the chemical layer 3110 on the top surface of the patterned photoresist layer 3060 has a substantially same thickness as the chemical layer 3110 on the surface of the patterned photoresist layer 3060 that defines the surrounding wall 3090. In some embodiments, the chemical layer 3110 has a thickness at least half of the channel width of the channel 3080 in the patterned photoresist layer 3060. In some embodiments, the thickness of the chemical layer 3110 is about 50 Å to about 400 Å.

The chemical layer 3110 is formed by any suitable process. In some embodiments, forming the chemical layer 3110 includes: forming a shrink material over exposed portions of the tri-layer resist stack 3050 (for example, over exposed portions of the patterned photoresist layer 3060 and exposed portions of the middle layer 3050b, such that the shrink material fills the holes 3070a, 3070b, 3070c defined in the patterned photoresist layer 3060); baking the shrink material, such that the shrink material reacts with the patterned photoresist layer 860 to form the chemical layer 3110; and removing an unreacted portion of the shrink material (for example, portions of the shrink material on the middle layer 3050b), such that the holes 3170a, 3170b, 3170c are formed through the chemical layer 3110. In some embodiments, the shrink material is formed over the patterned photoresist layer 3060 and middle layer 3050b (for example, over the holes 3070a, 3070b, 3070c defined in the patterned photoresist layer 3060) using a suitable spin-on process. In some embodiments, the shrink material is baked at a baking temperature of about 110° C. to about 170° C. In some embodiments, the shrink material is baked for about 60 seconds. The unreacted portion of the shrink material is removed using a suitable development process. In some embodiments, the development process includes a puddle development process (for example, where the unreacted portion of the shrink material is washed away with water (for example, de-ionized water (DIW) for about 60 seconds)), an immersion development process, a spray development process, another suitable development process, or a combination thereof. The shrink material includes an inorganic material (such as a dielectric material), an organic material (such as a polymeric material), or a combination thereof. In some embodiments, an example of a water soluble organic material that may be used as the shrink material is commercially available from Dow Chemical Corporation or JSR Corporation. In some embodiments, the shrink material is a topaz-type material, such as that commercially available from Applied Materials, Santa Clara, Calif. In some embodiments, the shrink material is an inter-mixing type polymer.

Figure 32A:
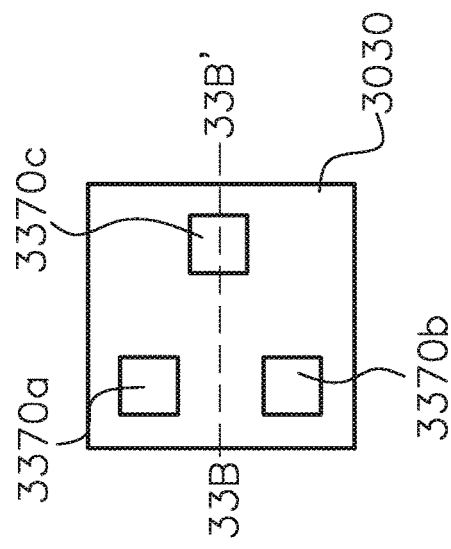
FIG. 32A is a schematic sectional top view illustrating another stage in the fabrication of the semiconductor structure according to the method of FIG. 29.
Figure 32B:
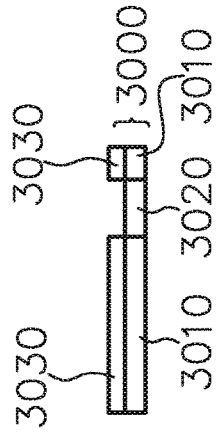
FIG. 32B is a schematic sectional view taken on line 32B-32B' of FIG. 32A.

FIG. 32A is a schematic top view illustrating another stage in the fabrication of the semiconductor structure 3000 according to the method 2900 of FIG. 29, and FIG. 32B is a schematic sectional view taken on line 32B-32B' of FIG. 32A. In FIG. 32A and FIG. 32B, the opening in the patterned chemical layer 3110 is transferred to the hardmask layer 3040. For example, an opening is formed through the hardmask layer 3040. In FIG. 32A, the opening includes three spaced apart holes (a hole 3270a, a hole 3270b, and a hole 3270c). In some embodiments, an etching process is performed to remove portions of the middle layer 3050b, the bottom layer 3050a, and the hardmask layer 3040 to expose the IMD layer 3030. The etching process uses the patterned chemical layer 3110 as an etching mask. As such, the holes 3270a, 3270b, 3270c in the patterned hardmask layer 3040 have a substantially same hole pitch and a substantially same hole width as the holes 3170a, 3170b, 3170c in the chemical layer 3110. The etching process is a dry etching process, another suitable anisotropic etching process, or a combination thereof. The etching process uses $SCF_4$, $CH_xF_y$, $C_4F_{30}$, $Cl_2$, $O_2$, $N_2$, Ar, $CH_4$, another etching gas, or a combination thereof. In some embodiments, the etching process is conducted at a pressure of about 5 mTorr to about 50 mTorr. In some embodiments, the etching process is conducted at a bias voltage of about 10 V to about 50 V. After patterning the hardmask layer 3040 (for example, following the formation of the holes 3270a, 3270b, 3270c in the hardmask layer 3040), the tri-layer resist stack 3050 is removed by a strip process, thereby removing the chemical layer 3110. In an example, the strip process is a wet strip process and is performed using, for example, hydrofluoric acid (HF). In another example, the strip process is a dry strip process and is performed using, for example, $CH_3$ or $BF_3$.

Figure 33A:
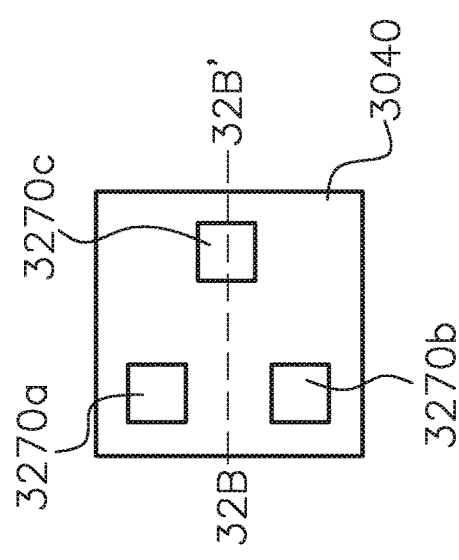
FIG. 33A is a schematic sectional top view illustrating another stage in the fabrication of the semiconductor structure according to the method of FIG. 29.
Figure 33B:
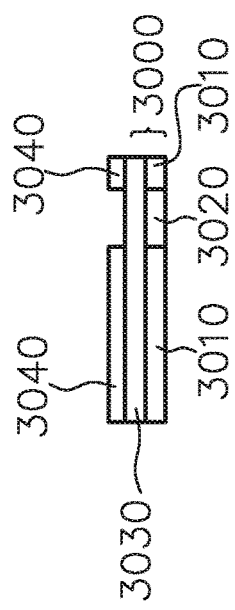
FIG. 33B is a schematic sectional view taken on line 33B-33B' of FIG. 33A.

FIG. 33A is a schematic top view illustrating another stage in the fabrication of the semiconductor structure 3000 according to the method 2900 of FIG. 29, and FIG. 33B is a schematic sectional view taken on line 33B-33B' of FIG. 33A. In FIG. 33A and FIG. 33B, the opening in patterned hardmask layer 3040 is transferred to the IMD layer 3030. For example, an opening is formed through the IMD layer 3030. The opening includes three spaced apart holes (a hole 3370a, a hole 3370b, a hole 3370c) formed through the IMD layer 3030. In some embodiments, the holes 3370a, 3370b, 3370c in the IMD layer 3030 are disposed, such that centers of the holes 3370a, 3370b, 3370c in the IMD layer 3030 are disposed at vertices of a triangle. An etching process is performed to remove portions of the IMD layer 3030, forming the holes 3370a, 3370b, 3370c that respectively expose conductive lines 3020. The etching process uses the hardmask layer 3040 as an etching mask. In some embodiments, the holes 3370a, 3370b, 3370c in the IMD layer 3030 have a substantially same hole pitch and a substantially same hole width as the holes 3270a, 3270b, 3270c in the patterned hardmask layer 3040. After patterning the IMD layer 3030 (for example, to form the holes 3370a, 3370b, 3370c in the IMD layer 3030), the hardmask layer 3040 is removed by an etching process. The etching process is a wet etch process, a dry etch process, another suitable etch process, or a combination thereof.

Following the removal of the hardmask layer 3040, the opening in the IMD layer 3030 (for example, holes 3370a, 3370b, 3370c) may be filled with a conductive material. In some embodiments, a sputtering process forms a conductive material over the IMD layer 3030 that fills the holes 3370a, 3370b, 3370c. In some embodiments, the conductive material is Al, Cu, Ni, another metal material, or a combination thereof. Thereafter, a chemical mechanical planarizing (CMP) process may be performed to remove the excess conductive material, such as conductive material formed on a top surface of the IMD layer 3030. The conductive material remaining in the holes 3370a, 3370b, 3370c serves as vertical interconnects. For example, in some embodiments, the semiconductor structure 3000 can include vertical interconnects formed in the IMD layer 3030, such as vertical interconnects (formed by conductive material filling the holes 3370a, 3370b, 3370c) to conductive lines 3020.

It is noted openings (having one or more holes) formed in the insulative layers 210, 810, 1310, 1910, 2410, 3010, which are subsequently filled with conductive material to form the conductive lines disposed in the insulative layers 210, 810, 1310, 1910, 2410, 3010, may be formed using the processes as described above with reference to FIGS. 2A-6C, FIGS. 8A-11C, FIGS. 13A-17C, FIGS. 19A-22C, FIGS. 24A-28C, and FIGS. 30A-33B, respectively.

In accordance with some embodiments, a method for fabricating a semiconductor structure provides a dielectric layer and a patterned photoresist layer is formed over the dielectric layer. An opening (hole) is formed in the patterned photoresist layer, and in some embodiments, the opening extends through the patterned photoresist layer. In some embodiments, a surrounding wall of the patterned photoresist layer defines the opening, where the surrounding wall has a generally peanut-shaped cross section.

In accordance with some embodiments, a method for fabricating a semiconductor structure provides a dielectric layer and a patterned photoresist layer is formed over the dielectric layer. An opening is formed in the patterned photoresist layer, and in some embodiments, the opening extends through the patterned photoresist layer. In some embodiments, the opening includes at least a pair of holes and at least one channel. The at least one channel interconnects the at least the pair of holes.

In accordance with some embodiments, a tri-layer resist stack includes a bottom layer, a middle layer, and a patterned photoresist layer. The middle layer is disposed over the bottom layer, and the patterned photoresist layer is disposed over the middle layer. An opening (hole) is formed in the patterned photoresist layer, and in some embodiments, the opening extends through the patterned photoresist layer. In some embodiments, a surrounding wall of the patterned photoresist layer defines the opening, where the surrounding wall has a generally peanut-shaped cross section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   providing a dielectric layer;
   forming a patterned photoresist layer over the dielectric layer, the patterned photoresist layer being formed with a hole therethrough defined by a surrounding wall, wherein the surrounding wall of the patterned photoresist layer has a generally peanut-shaped cross section; and
   forming a chemical layer on a top surface and the surrounding wall of the patterned photoresist layer, the chemical layer being formed with a pair of spaced apart holes therethrough,
   wherein a pitch of the pair of spaced apart holes through the chemical layer is substantially the same as a pitch of two end sections of the hole through the patterned photoresist layer.

2. The method of claim 1, wherein the chemical layer has a thickness at least half of a width of a middle section of the hole in the patterned photoresist layer.

3. The method of claim 1, wherein the forming the chemical layer includes:
   forming a shrink material over the patterned photoresist layer and the dielectric layer,
   performing a baking process on the shrink material to react the shrink material with the patterned photoresist layer, whereby reacted shrink material forms the chemical layer, and
   removing unreacted shrink material.

4. The method of claim 3, wherein the shrink material is baked at a temperature of about 110° C. to about 170° C. and for about 60 seconds.

5. The method of claim 1, further comprising performing an etching process on the dielectric layer using the chemical layer as an etching mask to form a pair of spaced apart holes through the dielectric layer.

6. A method of fabricating a semiconductor structure, comprising:
   providing a dielectric layer;
   forming a first hardmask layer over the dielectric layer;
   forming a patterned photoresist layer over the first hardmask layer and the dielectric layer, the patterned photoresist layer being formed with at least a pair of holes and at least one channel that interconnects the at least a pair of holes through the patterned photoresist layer; and
   performing an etching process on the first hardmask layer to form at least two holes and at least one channel that interconnects the at least two holes through the first hardmask layer, wherein a pitch of the at least two holes through the first hardmask layer is substantially the same as a pitch of the at least pair of holes in the patterned photoresist layer.

7. The method of claim 6,
wherein performing the etching process on the first hardmask layer comprises using the patterned photoresist layer as an etching mask to form the at least a pair of holes and the at least one channel that interconnects the at least a pair of holes through the first hardmask layer.

8. The method of claim 7, wherein the at least a pair of holes and the at least one channel in the first hardmask layer are defined by a surrounding wall of the first hardmask layer, the method further comprising forming a second hardmask layer on the surrounding wall of the first hardmask layer to form at least a pair of spaced apart holes defined by the second hardmask layer.

9. The method of claim 8, wherein the second hardmask layer has a thickness at least half of a width of the at least one channel in the first hardmask layer.

10. The method of claim 8, wherein the forming the second hardmask layer includes:
forming the second hardmask layer over the first hardmask layer and the dielectric layer, and
removing the second hardmask layer that is on the dielectric layer.

11. The method of claim 8, further comprising performing an etching process on the dielectric layer using the second hardmask layer as an etching mask to form at least a pair of spaced apart holes through the dielectric layer.

12. The method of claim 7, wherein a width of the at least one channel through the first hardmask layer is substantially the same as a width of the at least one channel through the patterned photoresist layer.

13. A method of fabricating a semiconductor structure, comprising:
providing a dielectric layer;
forming a patterned photoresist layer over the dielectric layer, the patterned photoresist layer being formed with at least two holes therethrough and at least one channel that interconnects the at least two holes; and
forming a chemical layer on a top surface to form at least two spaced apart holes through the chemical layer;
wherein a pitch of the at least two spaced apart holes through the chemical layer is substantially the same as a pitch of the at least two holes in the patterned photoresist layer.

14. The method of claim 13, wherein the chemical layer has a thickness at least half of a width of the at least one channel in the patterned photoresist layer.

15. The method of claim 13, further comprising performing an etching process on the dielectric layer using the chemical layer as an etching mask to form at least two spaced apart holes through the dielectric layer.

16. The method of claim 13, wherein the forming the chemical layer comprises:
forming a shrink material over the patterned photoresist layer and the dielectric layer;
performing a baking process on the shrink material to react the shrink material with the patterned photoresist layer, whereby reacted shrink material forms the chemical layer; and
removing unreacted shrink material.

17. The method of claim 16, wherein the shrink material is baked at a temperature of about 110° C. to about 170° C. and for about 60 seconds.

18. The method of claim 13, the method further comprising:
forming a hardmask layer that is disposed between the dielectric layer and the patterned photoresist layer; and
performing an etching process on the hardmask layer using the chemical layer as an etching mask to form at least two spaced apart holes through the hardmask layer.

19. The method of claim 18, further comprising performing an etching process on the dielectric layer using the hardmask layer as an etching mask to form at least a pair of spaced apart holes through the dielectric layer.

20. The method of claim 13, the method further comprising:
forming a bottom layer disposed between the dielectric layer and the patterned photoresist layer, the bottom layer being an organic film; and
forming a middle layer disposed between the bottom layer and the patterned photoresist layer.

* * * * *